United States Patent
Page et al.

(10) Patent No.: US 6,546,408 B2
(45) Date of Patent: *Apr. 8, 2003

(54) SINC FILTER USING TWISTING SYMMETRY

(75) Inventors: Joel Page, Austin, TX (US); Edwin De Angel, Austin, TX (US); Wai Laing Lee, Austin, TX (US); Lei Wang, College Station, TX (US); Hong Helena Zheng, Irvine, CA (US); Chung-Kai Chow, Austin, TX (US)

(73) Assignee: Cirrus Logic, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/153,860

(22) Filed: Sep. 16, 1998

(65) Prior Publication Data

US 2002/0038324 A1 Mar. 28, 2002

(51) Int. Cl.[7] .............................................. G06F 17/10
(52) U.S. Cl. ........................................ 708/319; 708/307
(58) Field of Search ................................ 708/300, 301, 708/307, 313, 316, 319

(56) References Cited

U.S. PATENT DOCUMENTS

| | | |
|---|---|---|
| 4,588,979 A | 5/1986 | Adams |
| 4,746,899 A | 5/1988 | Swanson et al. |
| 4,851,841 A | 7/1989 | Sooch |
| 4,872,129 A | 10/1989 | Pfeifer et al. |
| 4,999,626 A | 3/1991 | Asghar et al. |
| 5,012,245 A | 4/1991 | Scott et al. |
| 5,043,933 A | 8/1991 | Boutaud et al. |
| 5,051,981 A | 9/1991 | Kline |
| 5,079,734 A | 1/1992 | Riley |
| 5,212,659 A | 5/1993 | Scott et al. |
| 5,246,033 A | 9/1993 | Brehm et al. |
| 5,313,412 A * | 5/1994 | Nukui ......................... 708/319 |
| 5,455,782 A | 10/1995 | Young et al. |
| 5,517,395 A | 5/1996 | Weissman |
| 5,517,529 A | 5/1996 | Stehlik |
| 5,541,864 A | 7/1996 | Van Bavel et al. |
| 5,912,827 A * | 6/1999 | Sasaki ......................... 708/319 |
| 5,966,314 A * | 10/1999 | Lee ......................... 364/724.16 |

OTHER PUBLICATIONS

A. J. Stratakos et al., "High–Efficiency Low–Voltage DC–DC Conversion for Portable Applications", IWLPD '94 Workshop Proceedings, pp. 105–110.

E.B. Hogenauer, "An Economical Class of Digital Filters for Decimation and Interpolation", IEEE Trans. Acoust. Speech, Signal Proc., Apr. 1981, vol. ASSP–29, No. 2, pp. 155–162.

B. Leung, "The Oversampling Technique for Analog to Digital Conversion: A Tutorial Overview", Analog Integrated Circuits and Signal Processing 1, 1991, pp. 65–74.

M. Rebeschini et al., "A High–Resolution CMOS Sigma–Delta A/D Converter with 320 kHz Output Rate", IEEE Proc., ISCAS, 1989, pp. 246–249.

M. Alexander et al., "A 192kHz Sigma–Delta ADC with Integrated Decimation Filters Providing –97.4dB THD", 1994 IEEE ISSCC Digest Tech. Papers, 37, pp. 190–191.

* cited by examiner

Primary Examiner—Chuong Dinh Ngo
(74) Attorney, Agent, or Firm—Blakely Sokoloff Taylor & Zafman LLP

(57) ABSTRACT

A sinc filter is implemented by partitioning 1 bit wide incoming data into multibit words. The multibit words are multiplied by respective coefficient sets. Some multibit words are twisted by inverting the bit order and the multiplied using the same coefficient sets used for untwisted words. Multiplications are implemented using either look up tables or logic and the filter is implemented using only shifts and additions. The sinc filter is particularly useful applications in the field of data acquisition and particularly in the area of seismic sensing.

14 Claims, 36 Drawing Sheets

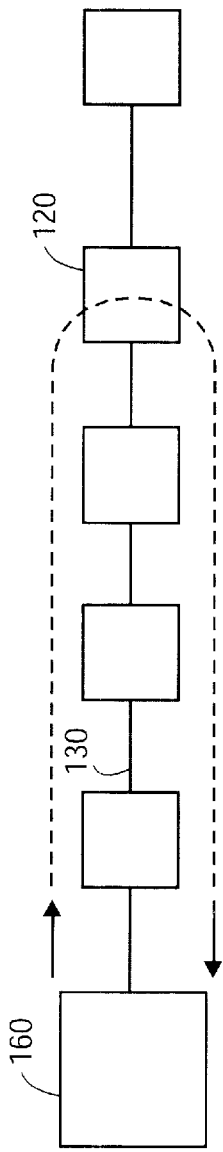

FIG. 13-1A 1ST ORDER SINC FILTER
FIG. 13-2A 2ND ORDER SINC FILTER
FIG. 13-3A 3RD ORDER SINC FILTER $$H(Z) = \frac{(1-Z^{-4})}{(1-Z^{-1})}$$

$$H(Z) = \frac{(1-Z^{-4})^2}{(1-Z^{-1})^2}$$

$$H(Z) = \frac{(1-Z^{-4})^3}{(1-Z^{-1})^3}$$

1) Sinc #2: $y_0 = lx_0+4x_{-1}+6x_{-2}+4x_{-3}+x_{-4}+lx_0+4x_{-1}+\overline{|4x_{-2}+2x_{-2}|}+4x_{-3}+x_{-4}$ 5 words, 6 additions

FIG. 18B-1 Sinc#3(1) = sinc#2

5 words, 6 additions

FIG. 18B-2 Sinc#3(2): $x_0 + 4x_{-1} + 10x_{-2} + 16x_{-3} + 19x_{-4} + 16x_{-5} + 10x_{-6} + 4x_{-7} + x_8$ $= x_0 + 4x_{-1} + \boxed{8x_{-2} + 2x_{-2}} + 16x_{-3} + \boxed{16x_{-4} + 2x_{-4} + x_{-4}} + 16x_{-5} + \boxed{8x_{-6} + 2x_{-6}} + 4x_{-7} + x_{-8}$ 9 words, 13 additions

FIG. 18B-3 Sinc#4: $x_0 + 5x_{-1} + 10x_{-2} + 10x_{-3} + 5x_{-4} + x_{-5}$ $= x_0 + \boxed{4x_{-1} + x_{-1}} + \boxed{8x_{-2} + 2x_{-2}} + \boxed{8x_{-3} + 2x_{-3}} + 4x_{-4} + \boxed{4x_{-4} + x_{-4}} + x_{-5}$ 6 words, 10 additions

FIG. 18B-4 Sinc#4: $x_0 + 6x_{-1} + 15x_{-2} + 20x_{-3} + 15x_{-4} + 6x_{-5} + x_{-6}$ $= x_0 + \boxed{4x_{-1} + 2x_{-1}} + \boxed{16x_{-2} - x_{-2}} + \boxed{16x_{-3} + 4x_{-3}} + \boxed{16x_{-4} - 4x_{-4}} + \boxed{4x_{-5} + 2x_{-5}} + x_{-6}$ 7 words, 12 additions

X * Y + ACC + RND

SINC FILTER USING TWISTING SYMMETRY

CROSS-REFERENCES TO RELATED APPLICATIONS

The invention disclosed herein is related to application Ser. No. 09/153,863, filed Sep. 16, 1998, by inventors Joel Page, Edwin De Angel, Wai Laing Lee, Lei Wang, Hong Zheng and Chung-Kai Chow and entitled "A POLYPHASE FILTER FOR SELECTIVE PHASE SHIFTING."

The invention disclosed herein is related to application Ser. No. 09/153,862, now U.S. Pat. No. 6,317,765, filed Sep. 16, 1998, by inventors Joel Page, Edwin De Angel, Wai Laing Lee, Lei Wang, Hong Zheng and Chung-Kai Chow and entitled "A SINC FILTER WITH SELECTIVE DECIMATION RATIOS."

The invention disclosed herein is related to application Ser. No. 09/153,866, now U.S. Pat. No. 6,321,246 filed Sep. 16, 1998, by inventors Joel Page, Edwin De Angel, Wai Laing Lee, Lei Wang, Hong Zheng and Chung-Kai Chow and entitled "A LINEAR PHASE FIR SINC FILTER WITH MULTIPLEXING."

The invention disclosed herein is related to application Ser. No. 09/154,242, filed Sep. 16, 1998, by inventors Joel Page, Edwin De Angel, Wai Laing Lee, Lei Wang, Hong Zheng, Chung-Kai Chow and entitled "NETWORK SYNCHRONIZATION."

The invention disclosed herein is related to application Ser. No. 09/153,861, filed Sep. 16, 1998, by inventors Joel Page, Edwin De Angel, Wai Laing Lee, Lei Wang, Hong Zheng and Chung-Kai Chow and entitled "CLOCK ALIGNMENT FOR REDUCED NOISE AND EASY INTERFACING."

The invention disclosed herein is related to application Ser. No. 09/153,869, filed Sep, 16, 1998, by inventors Joel Page, Edwin De Angel, Wai Laing Lee, Lei Wang, Hong Zheng and Chung-Kai Chow and entitled "A CHIP ARCHITECTURE FOR DATA ACQUISITION."

The invention disclosed herein is related to application Ser. No. 09/153,867, now U.S. Pat. No. 6,337,636, filed Sep. 16, 1998, by inventors Joel Page, Edwin De Angel, Wai Laing Lee, Lei Wang, Hong Zheng and Chung-Kai Chow and entitled "SYSTEM AND TECHNIQUES FOR SEISMIC DATA ACQUISITION."

The invention disclosed herein is related to application Ser. No. 09/153,864, filed Sep. 16, 1998, by inventors Joel Page, Edwin De Angel, Wai Laing Lee, Lei Wang, Hong Zheng and Chung-Kai Chow and entitled "POWER ON RESET TECHNIQUES FOR AN INTEGRATED CIRCUIT CHIP."

The invention disclosed herein is related to application Ser. No. 09/154,241, now U.S. Pat. No. 6,231,246, filed Sep. 16, 1998, by inventors Joel Page, Edwin De Angel, Wai Laing Lee, Lei Wang, Hong Zheng and Chung-Kai Chow and entitled "NOISE MANAGEMENT USING A SWITCHED CONVERTER."

The invention disclosed herein is related to application Ser. No. 09/153,868, now U.S. Pat. No. 6,243,733, filed Sep. 16, 1998, by inventors Joel Page, Edwin De Angel, Wai Laing Lee, Lei Wang, Hong Zheng and Chung-Kai Chow and entitled "CORRECT CARRY BIT GENERATION."

BACKGROUND OF THE INVENTION

1. Field of the Invention

The invention is directed to digital filters and, more particularly, to sinc filters which take advantage of twisting symmetry.

2. Description of Related Art

Systems for conducting seismic exploration are well known in the art. On land, a plurality of transducers are deployed over a region and configured to receive reflections of acoustic signals from different geophysical layers beneath the surface of the earth. Seismic sensors are connected over cables to signal conditioning, digitization and digital recording equipment. When utilizing a seismic system, a strong acoustic signal is generated by, for example, setting off an explosion or by utilizing an acoustic signal generator having a relatively high power output. Reflections of the acoustic signals from the geophysical layers are then received at the seismic sensors deployed over a given area and the signals recorded, typically, for later analysis.

One problem with seismic exploration is that it frequently occurs in remote areas. Once sensors are deployed over a large area and seismic data gathered, great expense would be incurred if data were corrupted by malfunctioning sensors or electronics and a seismic survey crew needed to return again to the site, set up equipment and re-gather the data.

Seismic exploration has exacting requirements for seismic sensors and for the electronics which processes the signals derived from seismic sensors. There is therefore a need to be able to test both the sensors and related equipment to ensure that both the devices and the associated electronics are functioning properly. It is important that the seismic data gathering equipment be able to synchronize the data gathered with the explosion used for a measurement. This is somewhat difficult when the timing of the explosion with respect to the triggering signal is unpredictable, as it is with, for example, dynamite.

SUMMARY OF THE INVENTION

The invention is directed to a sinc filter implemented by partitioning 1 bit wide incoming data into multibit words. The multibit words are multiplied by respective coefficient sets and some multibit words are twisted by inverting the bit order and the multiplied using the same coefficient sets used for untwisted words.

BRIEF DESCRIPTION OF THE DRAWINGS

FIG. 4 is a diagram showing how round trip delay time is measured for a remote station unit.

FIG. 5 is a diagram showing data shift resulting from round trip delay.

FIGS. 13-1A through 13-1C, FIGS. 13-2A through 13-2C and 13-3A through 13-3C show relative coefficients, response and transform representations of response of first order, second order and third order sinc filters, respectively.

FIGS. 18B-1 through 18B-4 show the mathematics for a similar implementation for each of sinc filters sinc#3 through sinc#5.

DESCRIPTION OF THE INVENTION

Figure 1:
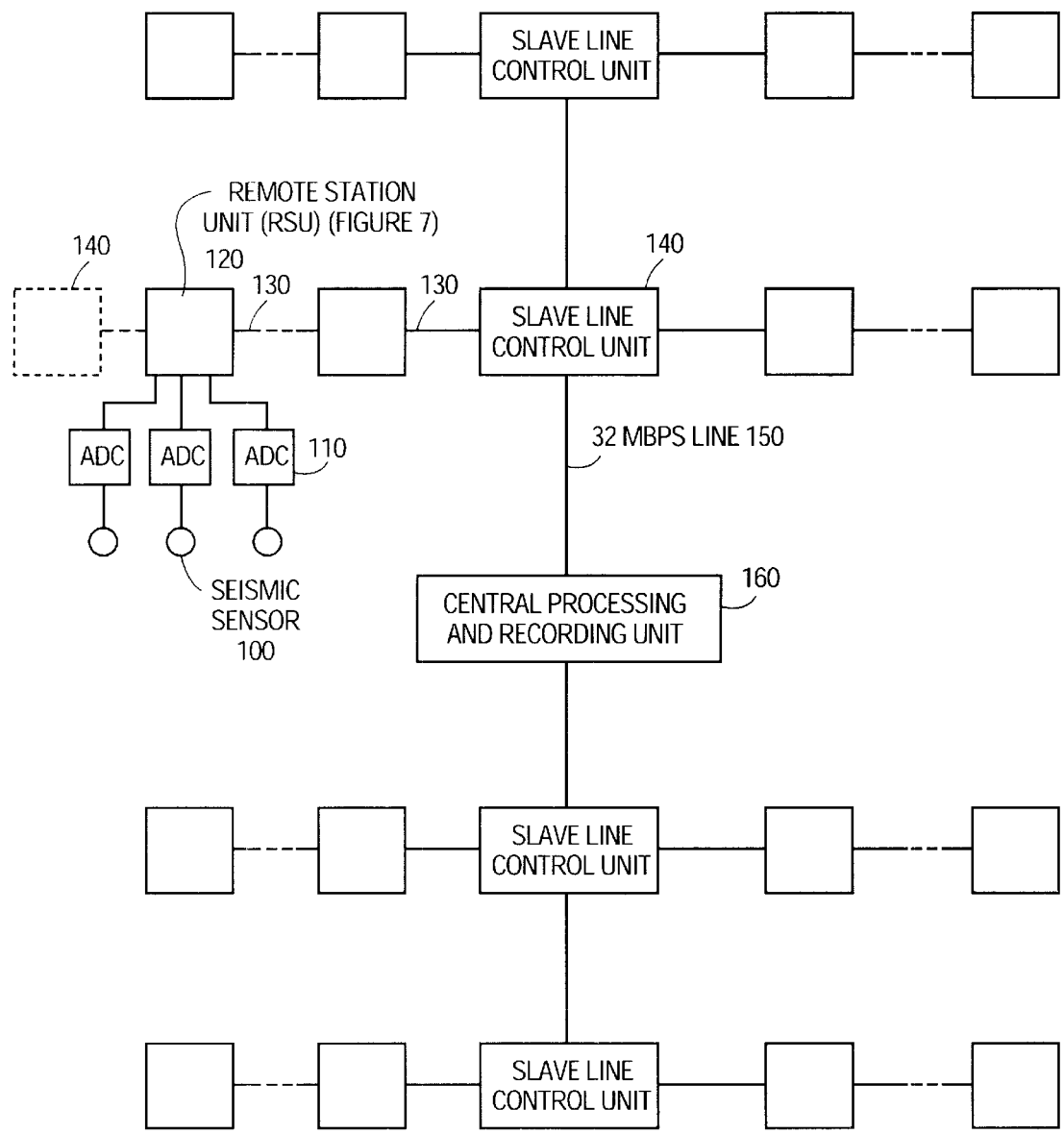
FIG. 1 is a block diagram of a network used to collect data from a plurality of seismic sensors in accordance with the invention.

FIG. 1 is a block diagram of a network used to collect data from a plurality of seismic sensors in accordance with the invention. A plurality of seismic sensors 100 are distributed over a large area. Each seismic sensor connects to a respective analog to digital converter (ADC) interface 110. The ADC interface 110 converts the analog output of its seismic sensor into a digital stream for application to a network interface referred to herein as a RSU (RSU) 120. The ADC interface can, of course, be designed to accommodate more than one RSU. RSU 120 is, preferably, an integrated circuit chip designed for low power consumption and shown more particularly in FIG. 7. RSUs 120 are connected to a digital telemetry cable 130 as shown more in detail in FIG. 2. A slave line control unit (SLCU) 140 interfaces digital telemetry cables 130 to a 32 Mbps line 150. The SLCU is similar to RSU 120 except configured to operate in a master mode. SLCU 140 sends information from a digital telemetry cable (s) which it services to the central processing and recording unit and passes information from the central processing and recording unit to the RSUs on the digital telemetry cable 130. The central processing and recording unit 160 collects the data from the sensors for geophysical analysis in a manner known in the art.

Figure 2:
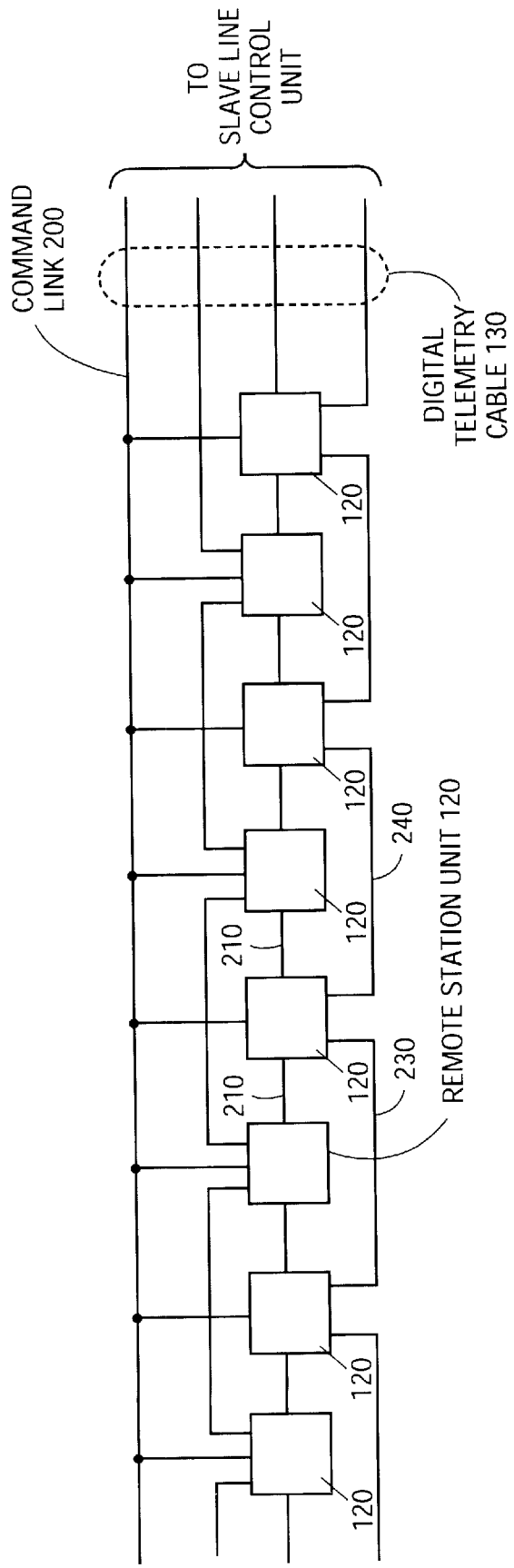
FIG. 2 is a block diagram showing interconnection of a plurality of remote sensing units in a network configuration permitting high data reliability.

FIG. 2 is a block diagram showing a preferred interconnection of a plurality of remote sensing units (RSUs) in a network configuration permitting high data reliability. Other network configurations are, of course, possible. The figure shows a plurality of redundant lines comprising digital telemetry cable 130. A command line or command link 200 connects to each of the RSUs as described more hereinafter. Each RSU 120 connects to each adjacent neighbor over links such as 210 and 220 shown in FIG. 2. The remote sensing unit also connects to each next adjacent neighbor over links such as links 230 and 240 shown in FIG. 2. In a preferred embodiment, the remote sensing unit has 4 data ports, each bidirectional in nature, and which permits a robustness of interconnection ensuring high reliability in the return of data from the seismic sensors over the digital telemetry cable 130. The particular data ports at the remote sensing unit 120 utilized for the data link return of information from the seismic sensors to the central processing and recording unit can be specified by the central processing and recording unit 160 as described more hereinafter.

The central processing and recording unit 160 sends commands to individual RSUs (RSU), groups of RSUs or to all RSUs over the command line. The command line utilizes two wire differential Manchester encoding and each RSU utilizes a phase lock loop to effectuate clock recovery from the incoming command line data. In a preferred implementation, the PLL clock recovery locks at a clock rate 16 times the line rate of the command line.

The network shown in FIG. 1 operates normally in a poll-select mode. The central processing and recording unit operates as a network master station which continuously polls one or more RSUs on an ongoing basis. When a station is polled and has information to send to the central, it returns a flag or a flag and data indicating that data is to be sent or is sent concurrently. When the RSU is selected for data transmission (i.e. authorized to transmit data by the central), the RSU sends data back over the data link. The particular port utilized to send the data has been previously set by the central processing and recording unit by information transmitted over the command line. Thus, the central processing and recording unit controls the individual ports utilized in each RSU and thus defines the data ports in use at each RSU for the return data link.

Figure 3A:
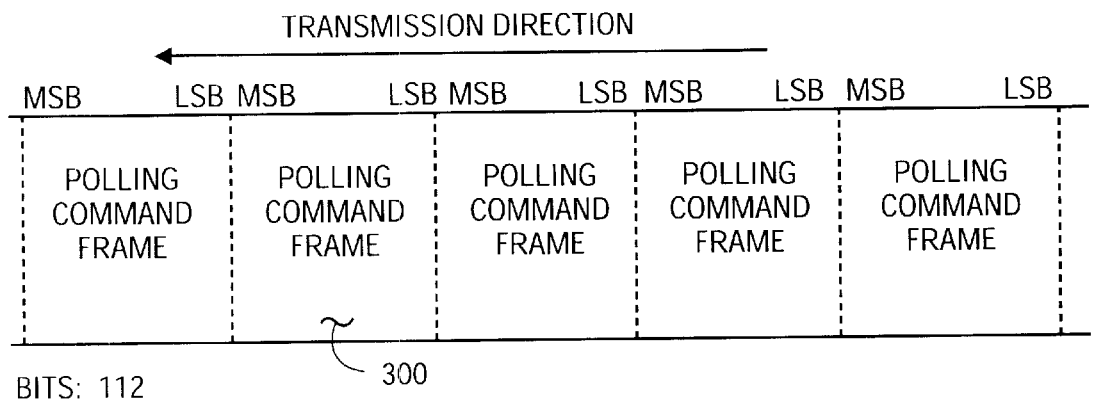
FIG. 3A is a diagram showing the transmission format utilized on the command link shown in FIG. 2.

FIG. 3A is a diagram showing the transmission format utilized on the command link shown in FIG. 2. The central processing and recording unit 160 sends a continuous stream of command frames over the command link as illustrated in FIG. 3.

Due to the nature of the data link, the slave nodes have always access to the data link. Setting of the slave nodes into a transmit or into a repeat mode on the data link is controlled by the master node. The master is usually only listening to the data link. The slave nodes transmit seismic data frames, status frames and auxiliary frames to the master node on the data link.

Figure 3B:
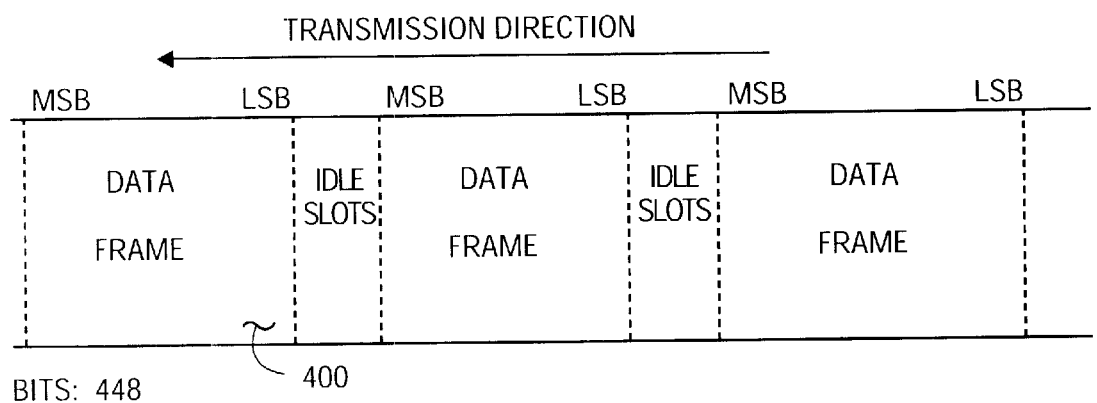
FIG. 3B is a diagram showing the transmission format on the data links shown in FIG. 2.

FIG. 3B is a diagram showing the transmission format on the data links shown in FIG. 2. A plurality of data frames 400 are transmitted repeatedly on the data link. Each data frame is separated from an adjacent data frame by zero or more idle slots. The actual number of idle slots employed between data frames is determined by the distance between nodes. The number of idle slots is utilized to ensure that there will be no collisions due to propagation delays on the link.

The data link may be operated selectively in a high rate mode and in a low rate mode. The RSU may operate in a number of operational modes. In a booting mode, a number of data links and command link transmission parameters are determined (e.g bit synchronization, frame synchronization), node configuration, etc. Every node/channel is assigned a logical network address during the booting mode.

In an initialization mode, the application modules in the RSU will be programmed through the telemetry interface (TMI). This involves downloading of control register values, the setting of program and coefficients for the digital signal processor and auxiliary nodes.

In an acquisition mode, a continuous poll/configuration/NOP command bit stream is received and a seismic/status/auxiliary word bit stream is transmitted to the slave line control unit 140 for passing to the central processing and recording unit 160.

The RSU can be set in a command loop back mode which is used for the measurement of node distances from the central. In the loop back mode, the received command bit stream will be looped back and transmitted on the data link back to the central. This can be optionally done with scrambling and descrambling to achieve desired spectral characteristics.

In a diagnostic node, the RSU can be utilized for detection of data links having degraded bit error rate performance. In this mode, the last node on a line is programmed to transmit a downloaded diagnostic pattern continuously and all other nodes detect the occurrence of the diagnostic (unique) pattern in the repeated bit stream. This, too, may be selectively scrambled.

Each RSU may operate in an SPI master mode in which it serves as a master node for a serial peripheral interface (SPI) bus. Alternatively, the RSU may operate in a SPI slave mode.

In a test mode, the internal telemetry functionality will be verified by running a test procedure from the central processing and recording unit operating as a system network controller.

Figure 3C:
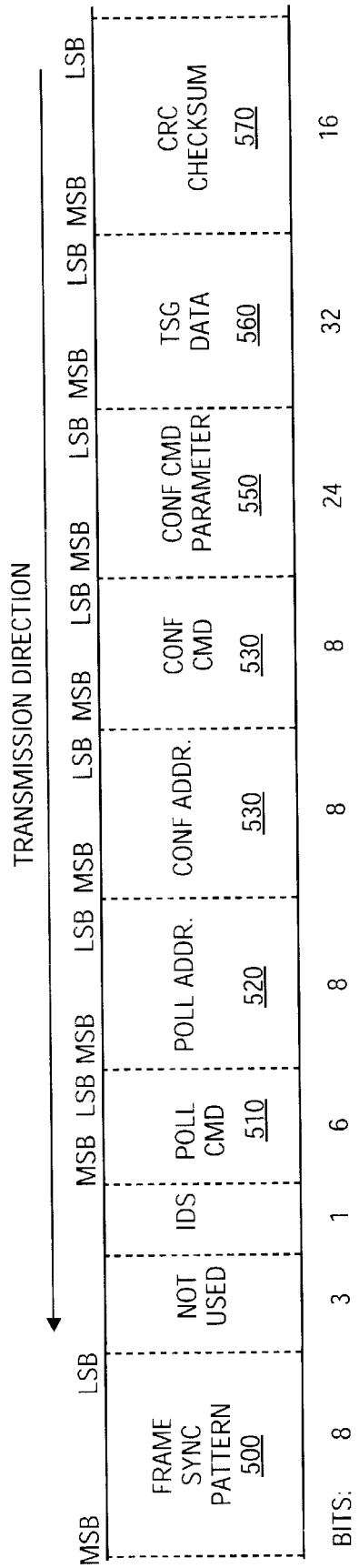
FIG. 3C is a diagram showing an exemplary arrangement of a command frame format in accordance with the invention.

FIG. 3C is a diagram showing an exemplary arrangement of a command frame format in accordance with the invention. The command frame format utilized on the command link begins with a frame sync pattern 500. A poll command 510 and a poll address 520 are utilized to specify the type of poll and the address of the station(s) designated to respond. The configuration address 530 and configuration command 540 together with parameters 550 are utilized to set configuration at one or more RSUs. The TSG data 560 is utilized to send information for driving a test signal generator in the RSU. The frame ends with a frame check sequence 570, preferably using a cyclic redundancy code (CRC) check sum.

Figure 3D:
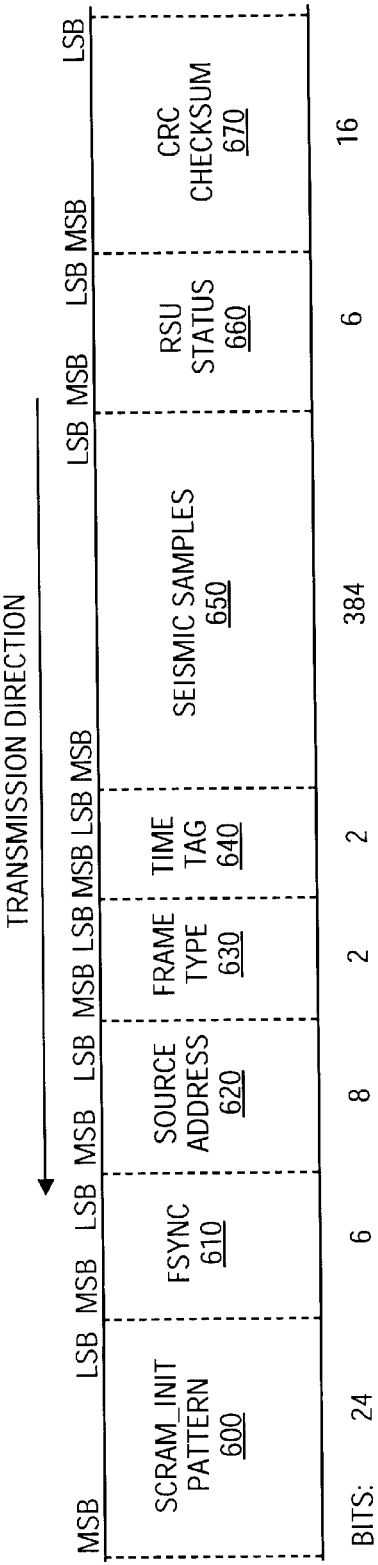
FIG. 3D is a diagram showing an exemplary data frame format utilized in accordance with the invention.

FIG. 3D is a diagram showing an exemplary data frame format utilized in accordance with the invention. The seismic data frame has a fixed length of 448 bits, configured as follows: The frame begins with a scrambling initiation pattern 600. It is followed by a frame sync pattern 610 indicating the start of data. The source address 620 identifies the RSU and, if more than one channel is utilized on the RSU, the channel which is the source of the data. A particular type of data frame can be specified in fields 630. A time tag 640 permits certain timing adjustments to be made. A plurality of seismic samples 650 then follow. Certain status flags can be sent in field 660. The seismic data frame ends with a CRC frame check sequence 670.

On the command link, frame synchronization is based on transmission of an eight bit long frame sync bit pattern in every transmitted command frame. The sync pattern alternates between a pattern A and a pattern B in consecutive command frames. Pattern A is the inverse of pattern B. A rest command occurs after command number 73 in the polling sequence and contains two C patterns which are used for detection of the remainder in the polling period.

There is no separate frame synchronization procedure for the data link transmission in the RSUs. The data link transmission are phase locked to the command link transmission.

The addresses for the individual RSUs are assigned by the master unit as a function of distance and polling occurs in address sequence, beginning with the closest RSU.

FIG. 4 is a diagram showing how round trip delay time is measured for a remote station unit. There are two major adjustments used in synchronizing the network. One adjusts for round trip delay. The other adjusts the timing of data gathering.

When adjusting for round trip delay, the central stations 400 places a particular RSU into a loop-back mode and sends a bit pattern, such as 0110100 over the command link. In an exemplary embodiment, the data link is operated at 4 times the rate of the command link. Since the clocks are synchronized, one bit from the command link will be sampled four times for transmission over the data link.

FIG. 5 is a diagram showing data shift resulting from round trip delay. In the example shown in FIG. 5, the loop backed version of the sampled synchronization pattern is compared in phase with the expected return signal. In the example shown in FIG. 5, two clock units of delay are experienced during the round trip. A single unit of delay added to the path will be traversed twice, once in the outgoing and once in the return direction, thus equalizing the delay to what it should be.

Figure 6A:
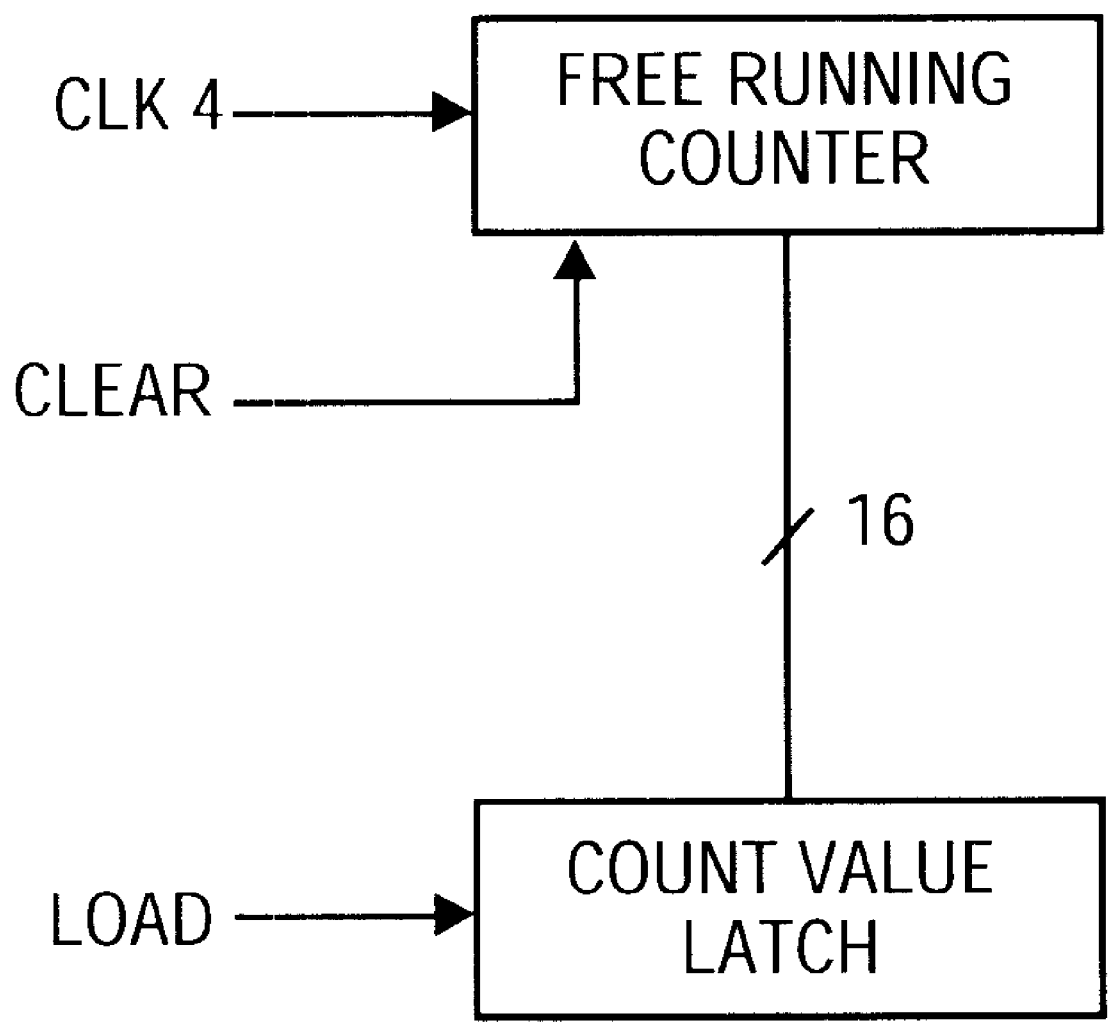
FIG. 6A is an illustration used for explaining network synchronization.
Figure 6B:
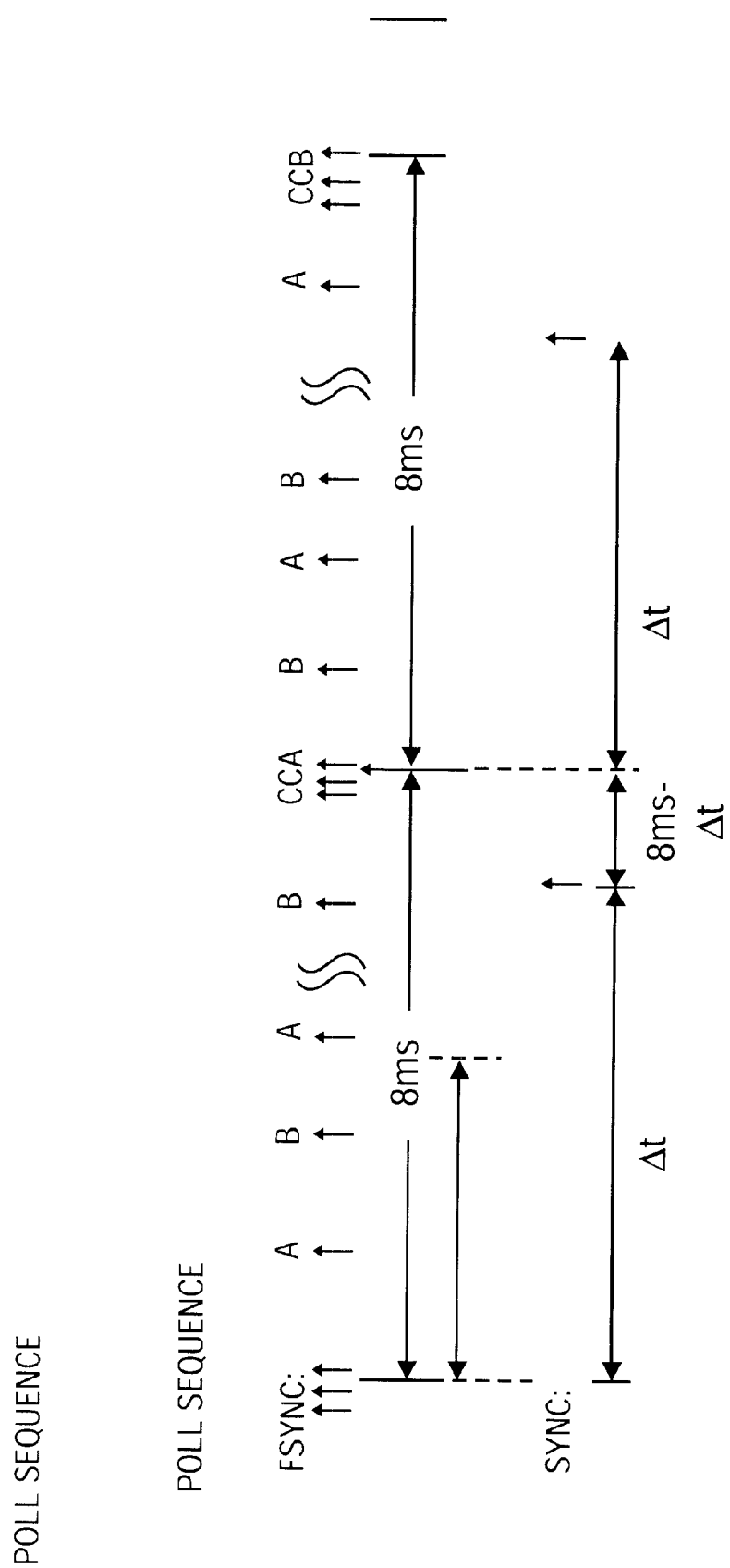
FIG. 6B shows synchronization sequences and how network synchronization

FIG. 6A is an illustration used for explaining network synchronization. A free running counter 600 runs at an exemplary 4 MHz rate. It is reset upon the first CCA or CCB pattern which occurs after a SYNC signal. The latch contains the selected CCA or CCB pattern. If a SYNC signal isn't received, nothing happens. When the next SYNC signal is actually received, the counter is reset and the amount of any error can be determined. These relationships are illustrated in FIG. 6B.

Figure 7:
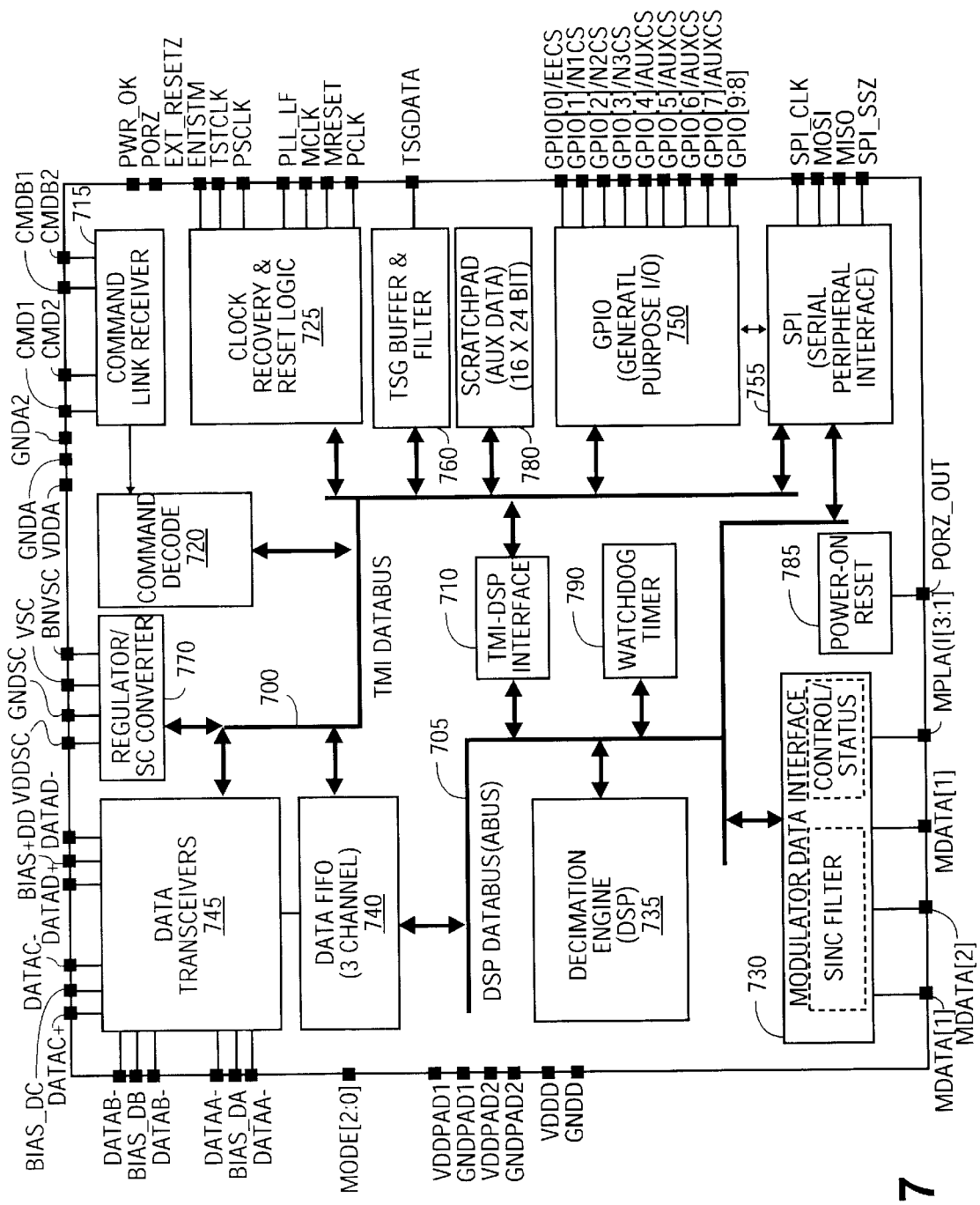
FIG. 7 is a block diagram showing chip pin connections and functional blocks of a RSU shown in FIG. 1.

FIG. 7 is a block diagram showing chip pin connections and functional blocks of an RSU shown in FIG. 1. As shown in FIG. 7, the command link receiver 715 connects to and receives commands over the command link 200. A set of buffered outputs are available for external use. The command link receiver passes commands to command decoder 720 where the commands are decoded or interpreted and appropriate commands and data sent over bus 700 to the various connected devices shown in FIG. 7 as functional blocks connected to the bus.

This chip shown in FIG. 7 also includes a separate digital signal processor (DSP) data bus 705. This bus is utilized in connection with the processing of signals received from ADC interface 110 over inputs MDATA[1], MDATA[2] and MDATA[3]. Certain portions of the data filtering discussed hereinafter occur in modulator data interface 730 with the remainder executed in the digital signal processor 735. The allocation described hereinafter is preferred, but other allocations are possible. When the processing of the incoming digital signals is completed by the Modulator Bus Interface and the DSP and it is desired to transmit the data to the central processing and recording unit 160, the data is applied through data FIFO 740 to data transceiver 745. The data transceivers 745 include four ports referred to generally as DATAA, DATAB, DATAC and DATAD in FIG. 7. Those four ports are utilized to achieve the network conductivity described in conjunction with FIG. 2.

General purpose I/O (GPIO) 750 can be used to pass signals to one or more attached devices, such as passing control signals to ADC interface 110. The serial peripheral interface 755 can likewise be utilized to communicate with external peripherals and, in one application, can be utilized to upload code to programmable devices on the ADC interface 110.

The regulator/SC converter 770 is utilized to provide a programmable DC—DC converter to permit selective voltage levels to be generated for the chip. This is discussed more hereinafter.

The TSG buffer and filter 760 is utilized to send test signal data to the ADC interface 110 for testing purposes.

The scratch pad memory 780 is utilized for calculations on an as needed basis. The watch dog timer 790 ensures that the DSP data bus 705 does not hang up without being noticed.

As part of the bootup/initialization of the network, the central processing and recording unit 160 broadcasts a rough delay value to all RSUs. That value is the same for all RSUs and is stored in a register within the chip 120 for delay equalization purposes. After that is done, the central processing and recording unit 160 polls each of the individual RSUs, one at a time, sends a loop back command to the RSU to cause the data received over the command link to be looped back over one of the data links to the central processing and recording unit 160, thus permitting the central processing and recording unit 160 to measure the round trip delay from the central to the RSU and back. Once the amount of delay is determined based on the round trip delay, the central processing and recording unit 160 will load a register of the individual RSU with a fine delay value to be used for correcting for differences in delay. The amount of fine adjustment loaded in each RSU is different and is based on the described measurement of the round trip delay time. The goal is to have all nodes sampling at the same point in absolute time so that data received at the central processing and recording unit from each of the nodes will have the same time base.

Figure 8:
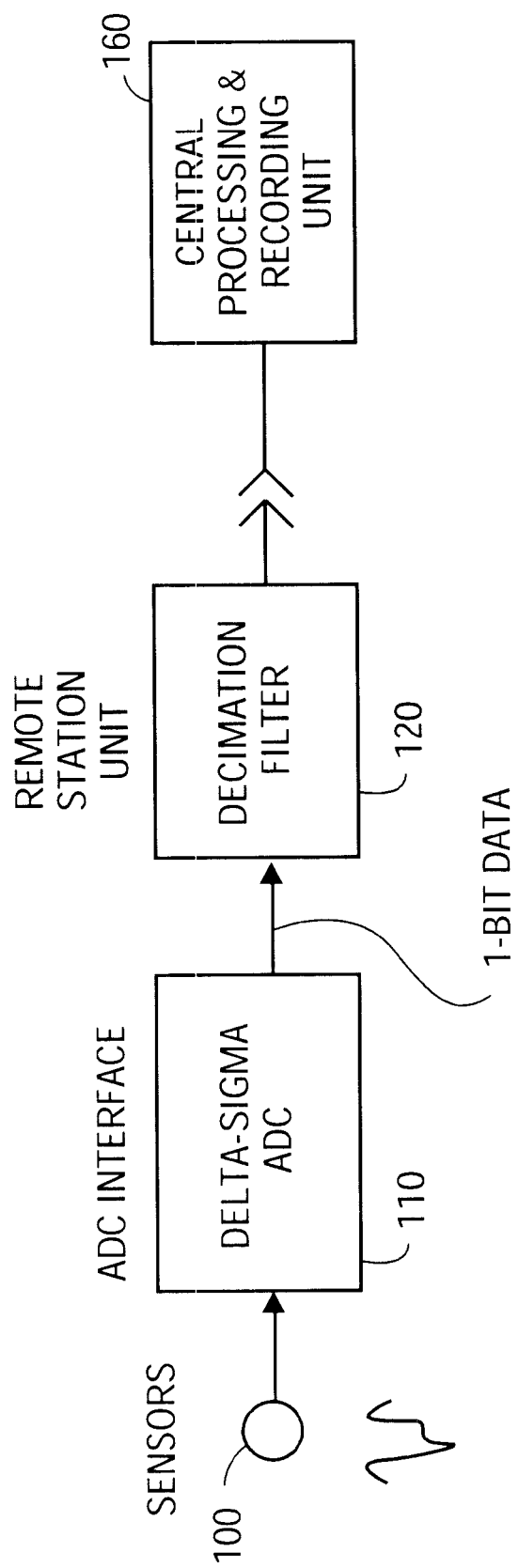
FIG. 8 is a block diagram showing signal processing of a seismic sensor output at a high level.

FIG. 8 is a block diagram showing at a high level signal processing of a seismic sensor output. The analog signal from seismic sensors 100 is passed through ADC interface 110 to certain decimation filtering implemented on RSU 120 as described more hereinafter and then through to the central processing and recording unit 160. In a preferred embodiment, it is received from the ADC interface 110 as 512 kHz, 1 bit delta-sigma data. The decimation on RSU 120 converts the one bit delta-sigma modulated data into 24 bit sample data having a recurrence rate ranging between 250 Hz and 4 KHz depending upon the settings of the decimation filter. This filtering will be discussed more hereinafter.

When the arrangement shown in FIG. 8 is utilized, there is a problem. The acoustic source utilized to gather seismic data is not synchronized with the seismic data acquisition system clock. This is particularly true when dynamite is utilized as the source of the acoustic impulse. Even if the triggering signal for the dynamite is synchronized with the seismic data acquisition system clock, there is an uncertain delay from the application of the triggering signal to the actual detonation of the dynamite. As a result, it is necessary to realign all channels of data in the time domain based on the actual detonation point. For a 512 kHz 1-bit sample rate, the decimated output data rate is only 1.0 kHz, but the time resolution of synchronization is required to be 4.0 microseconds or less. There are a number of sources of delay from the shooting time to the time of receiving data from all channels. The delay includes the network propagation delay, discussed above, and filter calculation delay.

Figure 9:
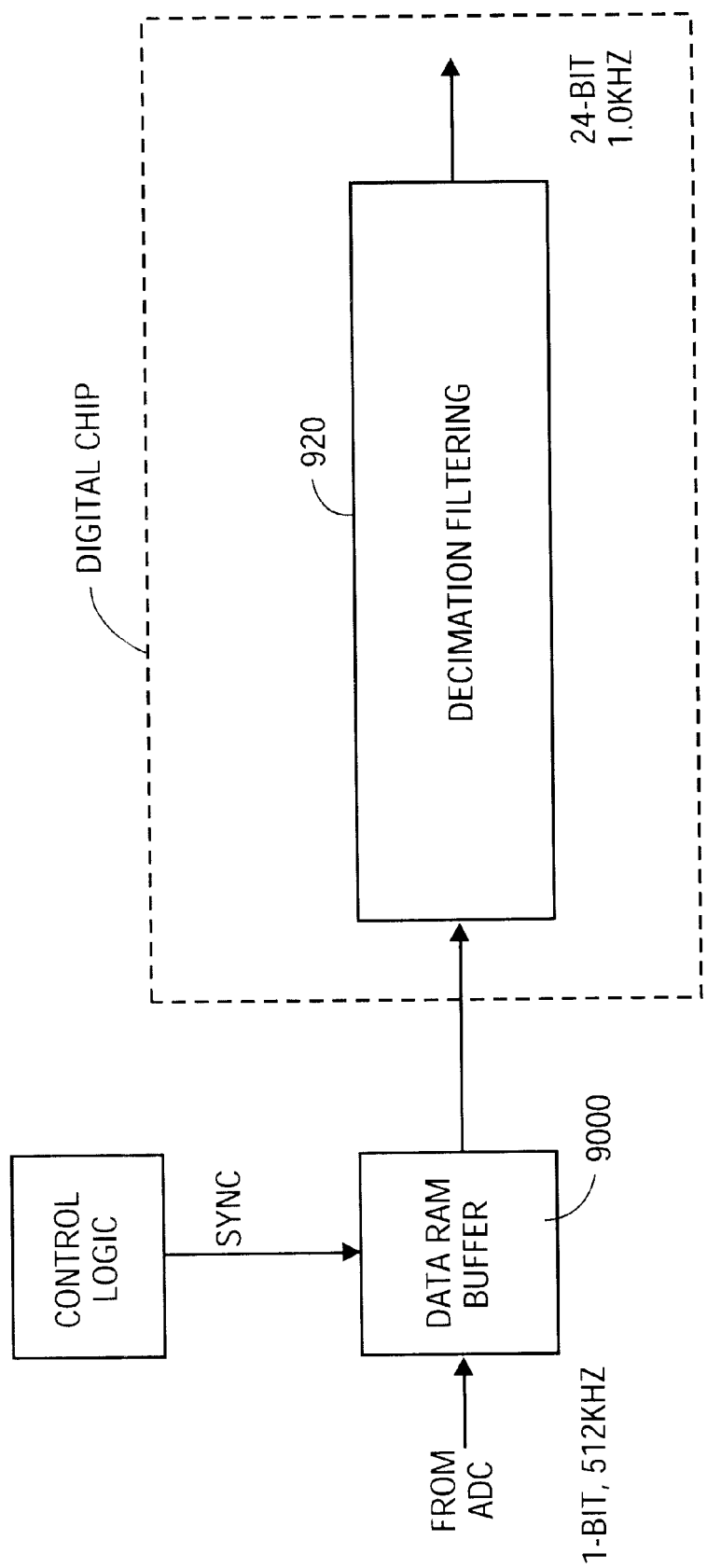
FIG. 9 is a block diagram showing a prior art approach to implementing the processing shown in FIG. 8.

FIG. 9 is a block diagram showing a prior art approach to solving the problem discussed in conjunction with FIG. 8. In the prior art, to achieve that synchronization, the one bit signal from the ADC interface 110 was applied to a data RAM buffer 900 and stored there until a synchronization signal was received from control logic 910 indicating that the shot had occurred. The data samples were then read beginning with a point in the data RAM buffer which corresponded to the needed amount of delay to synchronize the data with the shot. Once that point was identified, data was passed to a digital processing chip. There variable decimation filtering would occur resulting in an N-bit 1.0 kHz output signal.

The approach shown in FIG. 9 has several disadvantages. First a long systematic delay requires a large amount of storage, so much so that an additional RAM chip is required before decimation in order to store the data after the shot at the resolution of the sampling rate. That increases expense and reduces reliability. There is also a need for extra control logic. For example, at a 512 kHz sample rate, for each data conversion channel, a systematic delay of 50 milliseconds (typical) needs a RAM size of 25.6 kilobits. If the chip shown in FIG. 7 handles three data conversion channels as the chip shown in FIG. 7 does, it would require 76.8 kilobits of storage.

Figure 10:
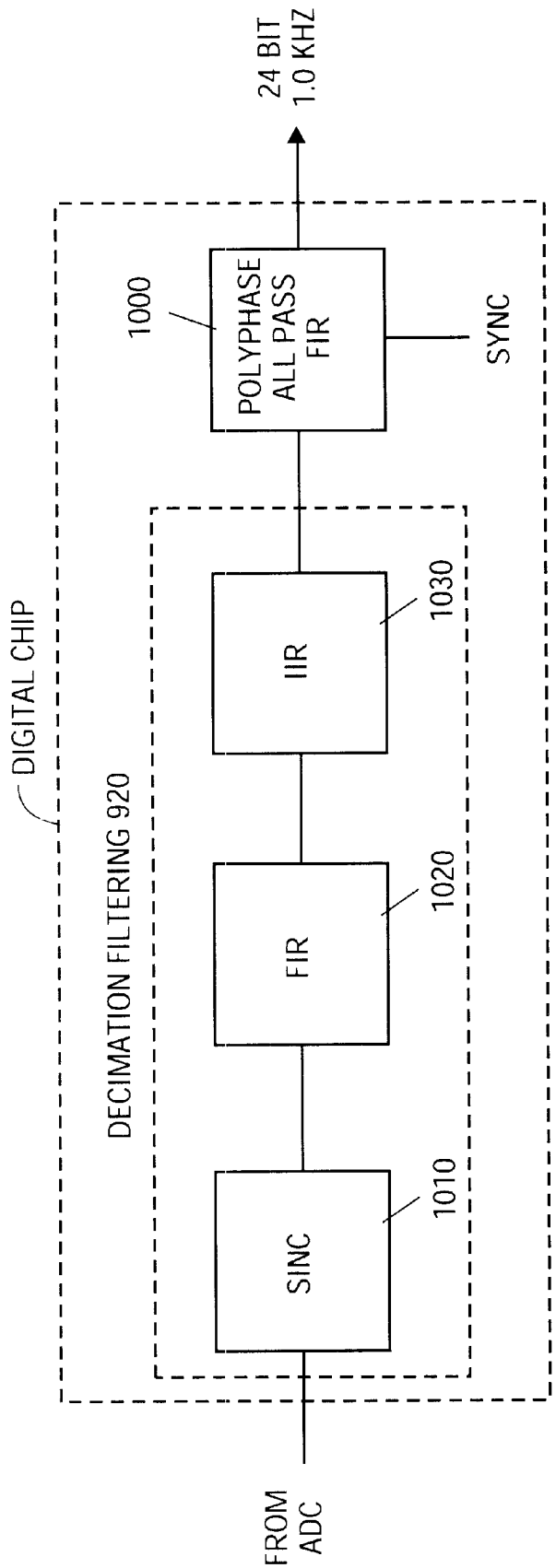
FIG. 10 is a block diagram showing an improved approach to seismic processing utilizing a polyphase filter in accordance with the invention.

FIG. 10 is a block diagram showing an improved approach to seismic processing utilizing a polyphase filter in accordance with the invention. After decimation filtering 920, a polyphase all-pass linear phase FIR filter is implemented and does the selective phase adjustment needed to bring the data into alignment with a shot. In this case, the all pass linear phase FIR filter adds a group delay of (N−1)*4.0 microseconds. By storing and selecting a number of filter parameter sets, N different all-pass filters can be selectively implemented resulting in a polyphase filter or phase shifter. Each set of coefficients provides a group delay of i*4.0 microseconds, where i=0, 1, 2, . . . , N−1.

If the output rate is 1.024 KHz and the synchronization resolution required is 4.0 microseconds, then one could implement selective delays between 0 and 50 msec at 4 μsec resolution by using a group polyphase filter with 256 sets of coefficients. The particular set of coefficients selected to add a group delay to the output data depending on the time of occurrence of the shot. Thus, each set of filter coefficients can implement a phase shifter having a discrete group delay of i*4 μsec, where i=0, 1, 2, . . . , 255.

When the central processing and recording unit 160 detects a shot, it sends a command (e.g. broadcast) specifying a time value for the shot. The time value can be established, for example, by detecting the explosion a the central processing and recording unit or by adding a known delay from the triggering instant. Upon receipt of that command, the amount of shift required to adjust the phase of the sampling to the timing of the shot is determined and a filter coefficient set is selected to impart the appropriate group delay to the polyphase all-pass linear phase FIR filter 1000. The polyphase filter thus makes the timing adjustment needed to synchronize with the shot. Thus, the phase adjustment imposed by the polyphase all-pass linear phase FIR filter 1000 varies from shot to shot and ensures that the data is synchronized with the shot. Further, since the decimation filtering process 920 removes the HF noise and lowers the data rate, very little storage is required.

In an exemplary implementation, a 256:1 decimation filter can be utilized with a sampling frequency Fs of 256 kHz with $N_{tot}$ taps. The coefficients of the filter can be decimated by the ratio 256 by picking up coefficients every 256 points. The coefficient of one set of polyphase filter is formed and the number of its taps is $N_{tot}/256$. There are thus totally 256 different sets of $N_{tot}/256$-tap linear phase FIR filters obtained from the decimation filter, each having a data rate equaling 1.0 kHz. Each set has a group delay difference of 4.0 microseconds from its adjacent sets of filter coefficients. Thus a phase shifter can be described as $h_{p(ij)}-h_{(j-1)}*256+i$, where i equals an integer from 1 to 256 and represents a number of the set and where j is a number from 1 to $N_{tot}/256$ which represents the numbering of the coefficients.

The coefficients for the ith set of coefficients for a polyphase filter are inversely symmetrical to the (256-i)th set of coefficients. Thus, the storage required to store the coefficients for the polyphase filter can be reduced by a factor of 2 by taking advantage of that symmetry.

Figure 11:
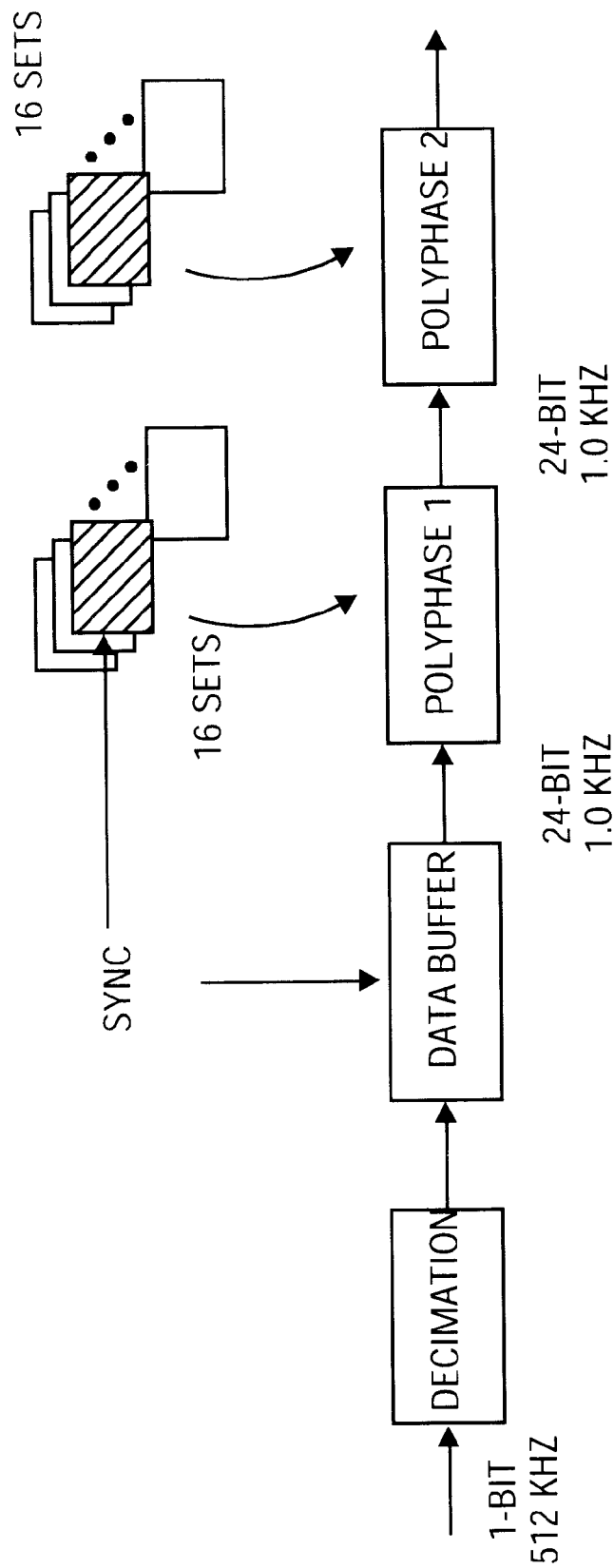
FIG. 11 shows an improved version of the polyphase filter utilizing cascaded polyphase filters.

FIG. 11 shows an improved version of the polyphase filter which utilizes cascaded polyphase filters. Several benefits can be achieved from splitting a polyphase filter into two polyphase filters. First the calculations needed for the cascade filter is about the same as the single stage polyphase filter but a reduced number of taps is required. In the example discussed in conjunction with FIG. 11, the polyphase filter 1 utilizes 16 sets of coefficients, each one differing from an adjacent set of coefficients by 64 μsec. Polyphase filter 2 then provides for 4 μsec resolution within the 64 μsec windows provided by polyphase filter 1. Thus, only 32 sets of coefficients are required in order to specify the 256 4 μsec windows required to achieve the resolution needed to synchronize with the shot over a 50 msec interval. If a single stage polyphase filter were utilized, then 256 sets of coefficients would be required. Thus, the coefficient storage requirements for the polyphase filter are reduced considerably by dividing the polyphase filter into two polyphase filters. Also, each set of cascade polyphase filter coefficients is shorter than a set of single stage polyphase filter. Even if a cascade calculation of two filters is needed, the total calculation amount is about the same as needed in the single stage polyphase filter.

Additionally, using a 2 stage polyphase filter, there is an ease of addressing associated with the selection of the overall delay required for synchronization to the shot. The amount of delay can be specified as a single byte with the 4 most significant bits specifying which of the 64 microsecond windows should be established by polyphase filter 1 and the least significant bits specifying the 4 microsecond window within the 64 microsecond window required to synchronize with the shot. Thus, a single word can be utilized to select the coefficients for both polyphase filter 1 and polyphase filter 2.

Figure 12:
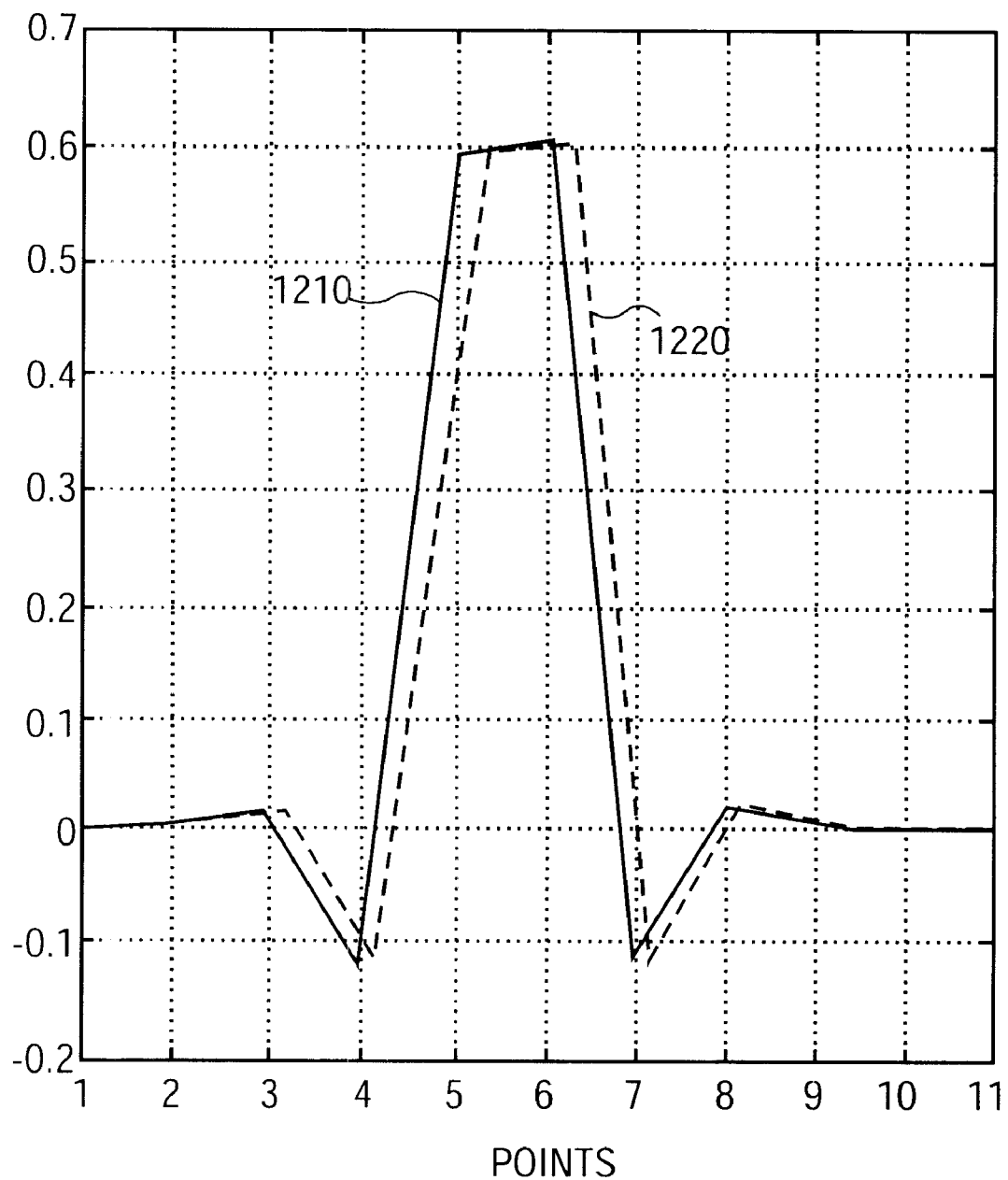
FIG. 12 is a graph showing the response of two members of a set of polyphase filters.
Figures 1B, 1C, 2B, 2C, 3B, 3C, 13:

FIG. 12 is a graph showing the response of two members of a set of polyphase filters. FIG. 12 shows two curves reflecting the response of a polyphase filter, each curve representing the response for a respective set of coefficients. In essence, the response is substantially identical but shifted in phase by a fraction of a sampling interval.

The polyphase filter described herein is much better than prior art techniques because the polyphase filter can be implemented on the digital chip resulting in the elimination of the extra RAM chip and its corresponding cost and reliability problems. It is suitable for use in any case where real-time high resolution synchronization is required and it reduces, ROM and calculation power needed over that required by the prior art.

In the chip architecture shown in FIG. 7, the polyphase filter and linear phase FIR filter and a IIR filter are implemented using the digital signal processor 735.

An exemplary set of coefficients for polyphase filter 1 is set forth in Appendix A. An exemplary set of coefficients for polyphase filter 2 is set forth in Appendix B.

FIGS. 13-1A through 13-1C, FIGS. 13-2A through 13-2C and 13-3A through 13-3C show sample weighing (coefficient values, response and transform representations of response of first order, second order and third order sinc filters respectively.

The decimation filtering 920 shown in FIG. 10 includes a sinc filter which receives the output of the ADC conversion accomplished by ADC interface 110. The sinc filters of the prior art consume more power than was desirable for the low power implementation of the invention. Sinc decimation filters are preferably used because they have well behaved transfer functions and high attenuation at the alias frequencies. In the time domain, they have relatively few taps and use small integer coefficients. A sinc filter can be realized in at least two ways. In one form, a sinc filter can be expressed as a cascade integrate-comb (CIC) filter. Such a filter has the following transfer function:

$$H(Z) = \frac{(1 - Z^{-R})^N}{(1 - Z^{-1})^N} \quad \text{(Equation 1)}$$

where R is the decimation ratio and N is the order of the filter. This can be realized as a combination of integrators and differentators.

Alternatively, a sinc filter can be expressed as a linear phase FIR filter. In this case:

$$y(n) = h_0 \cdot x(n) + h_1 \cdot x(n-1) + \ldots + h_{m-1} \cdot x(n-m+1) \quad \text{(Equation 2)}$$

where M is equal to the number of taps and where the taps are symmetric.

A CIC sinc filter implementation can be constructed of integrators and differentators in either a direct or cascade structure. While the CIC implementation uses only additions and permits easy achievement of variable decimation ratios, it uses considerable power and is therefore not suitable for low power filter design. In addition, the accumulator length grows very fast with filter order and decimation ratio which in turn also increases power consumption.

An linear phase FIR sinc filter implementation, on the other hand, has more complicated hardware requirements and more complicated operating sequences and would not likely normally be chosen for an IC design, but, in this implementation, it has the advantage that power savings can be achieved since (1) the quantities of computation required are decreased, (2) the register length can be kept at 24 bits or less, (3) one bit inputs permit table lookup of coefficients, (4) the coefficients are small and integer and (5) the filter can be implemented with shifts and additions.

Figure 14:
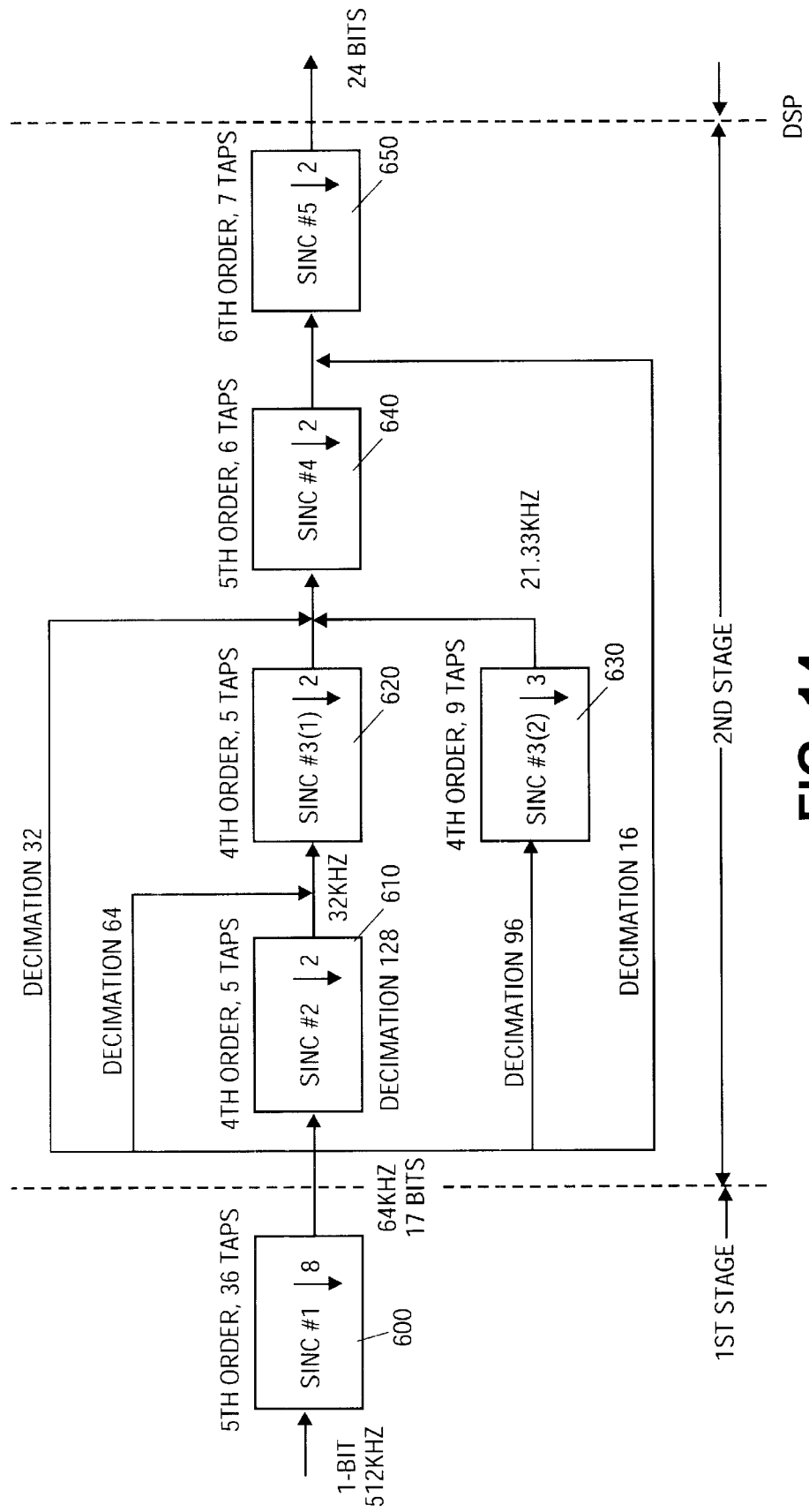
FIG. 14 is a block diagram showing a linear phase FIR sinc filter implementation with selectably variable decimations factors.

FIG. 14 is a block diagram showing a linear phase FIR sinc filter implementation with variable decimation factors. Variable order decimation in accordance with the invention can be achieved by switching in or out, selectively, a plurality of sinc decimation filters. A two stage decimation process is illustrated. The first stage, in a preferred embodiment, includes a fifth order, 36 tap linear phase FIR sinc filter used to decimate a 1 bit 512 kHz input by a factor of 8 to a 64 kHz 17 bit input. The output of the first stage sinc filter is applied to a pipe line arrangement of sinc filters which can be selectively activated in sequence to achieve desired decimation ratios. In the examples shown, decimation ratios of 16, 32, 64, 96 and 128 can be selected. Other arrangements can be implemented to achieve different ratios as desired. The sinc 1 linear phase FIR filter implementation has the advantage that it can be implemented with lookup tables and additions (see equation 2). The tables are small enough for direct implementation because the filter coefficients are symmetrical and because partial results are anti-symmetric for one bit inputs. Using these symmetries, one can reduce the ROM size required to about 25% of what would otherwise have been required.

Figure 15:
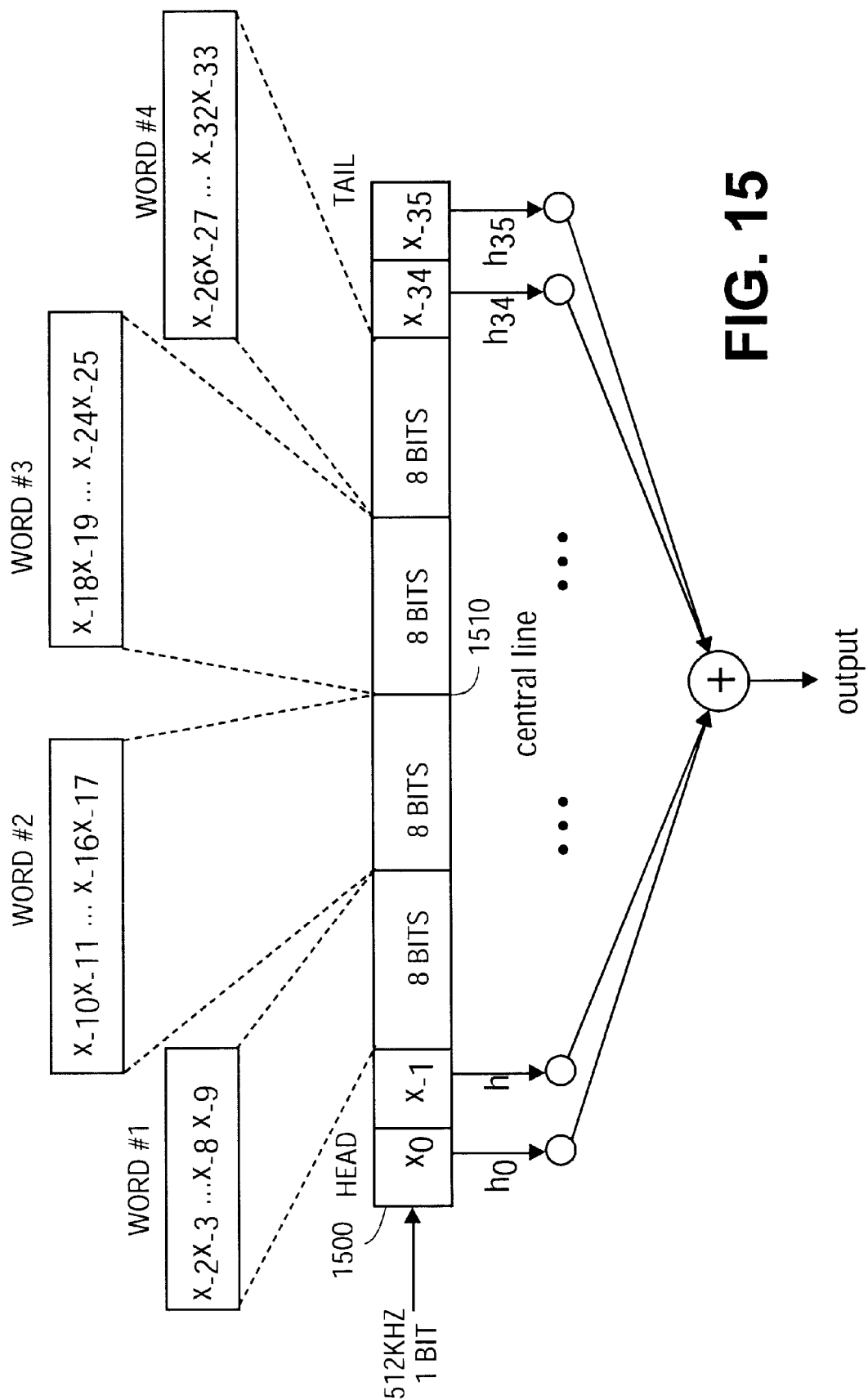
FIG. 15 is a diagram illustrating the principles of operation of sinc filter number 1 shown in FIG. 14.

FIG. 15 is a diagram illustrating the principles of operation of sinc filter sinc#1 shown in FIG. 14. The 512 kHz one bit input to the sinc 1 first stage input is fed into a serial register 1500. There is a central line 1510 which forms an axis of symmetry for analysis purposes. On either side of the symmetry line, 8 bit words are defined, namely word#1, word#2, word#3 and word#4 as shown in the figure. In this implementation, the register is 36 bits long. As a result, two bits, namely $X_0$ and $X_{-1}$ are left over on the left edge of the register. These bits will be referred to as the "head" bits. In addition, two bits are left over at the right extreme of the register, namely bits $X_{-34}$ and $X_{-35}$. These two bits are referred to as the "tail" bits. When multiplied by respective coefficients $H_i$ each of the bits in the register form an output.

Figure 16:
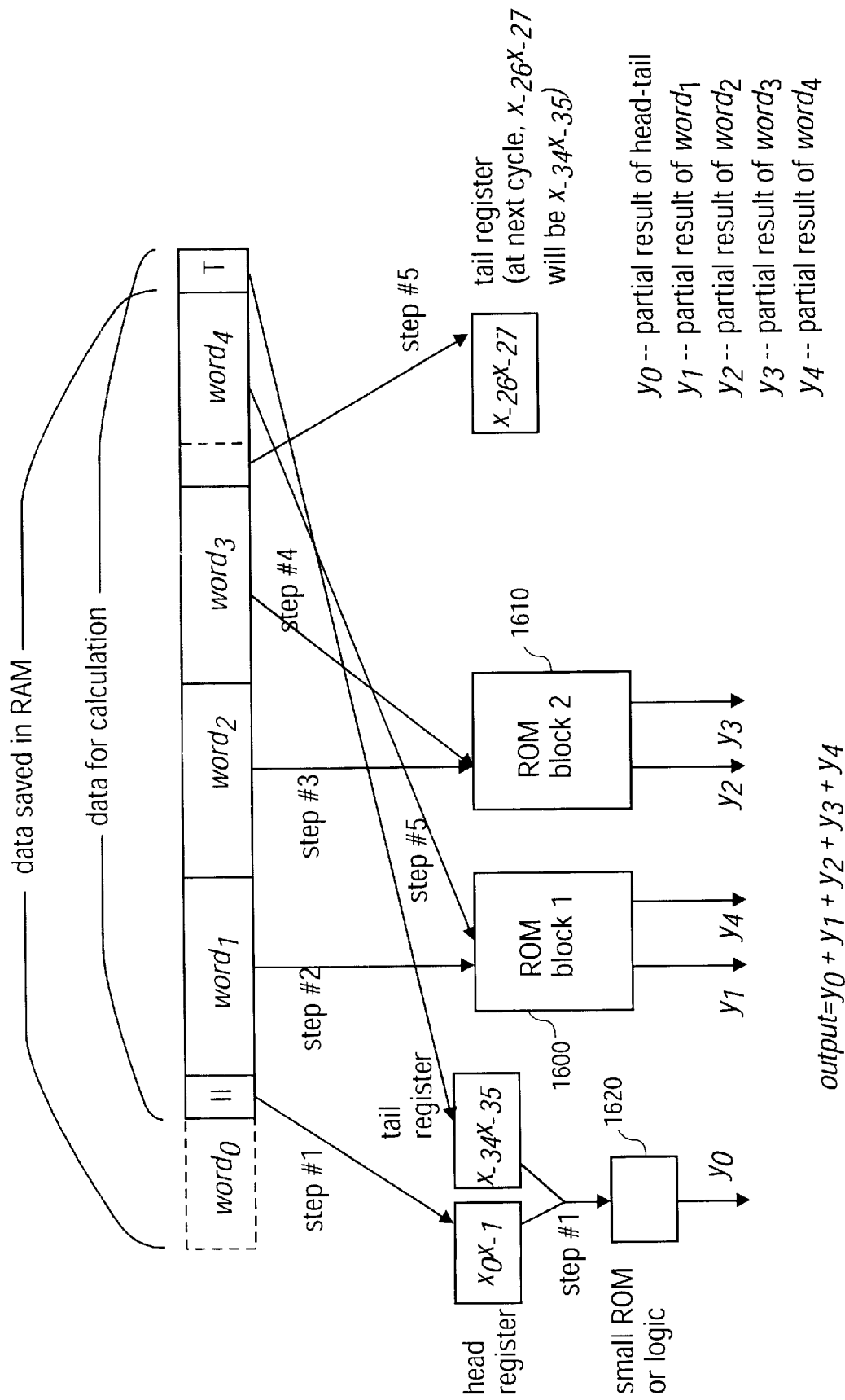
FIG. 16 is a block diagram showing functionally how the data illustrated in FIG. 15 are processed in an exemplary implementation.

FIG. 16 is a block diagram showing how the data discussed in conjunction with FIG. 15 are processed in an exemplary implementation. In FIG. 16, a convenient way of multiplying the incoming bits by the coefficients of the sinc filter is shown. A plurality of lookup tables 1600, 1610 and 1620 (implemented either as ROM or logic) are utilized for determining the corresponding output value for various combinations of bit values in the word used to access the look up table. The output value relates to the multiplication of those bits by the coefficients. As a first step, the head and the tail of the 36-bit data structure discussed in the previous figure are combined in respective head and tail registers and utilized to access the look up table or equivalent logic to produce an outgoing value Y0. In step 2, word#1 is utilized to look up a corresponding value Y1 in ROM 1600. In step 3, word#2 is utilized to lookup a value Y2 from ROM 1610. In step 4, word#3 is "twisted," meaning the bit order is reversed, and utilized to look up the value Y3 in ROM 1610. In step 5, word#4 is twisted and utilized to look up the value Y4 from 1600. The values Y0, Y1, Y2, Y3 and Y4 are summed to produce the output. The use of lookup tables in this manner reduces the amount of calculation required and thus power consumption.

Although the calculation process has been described here at a functional level, the actual circuitry utilized for implementation is described more in conjunction with the following figures.

Figure 17A:
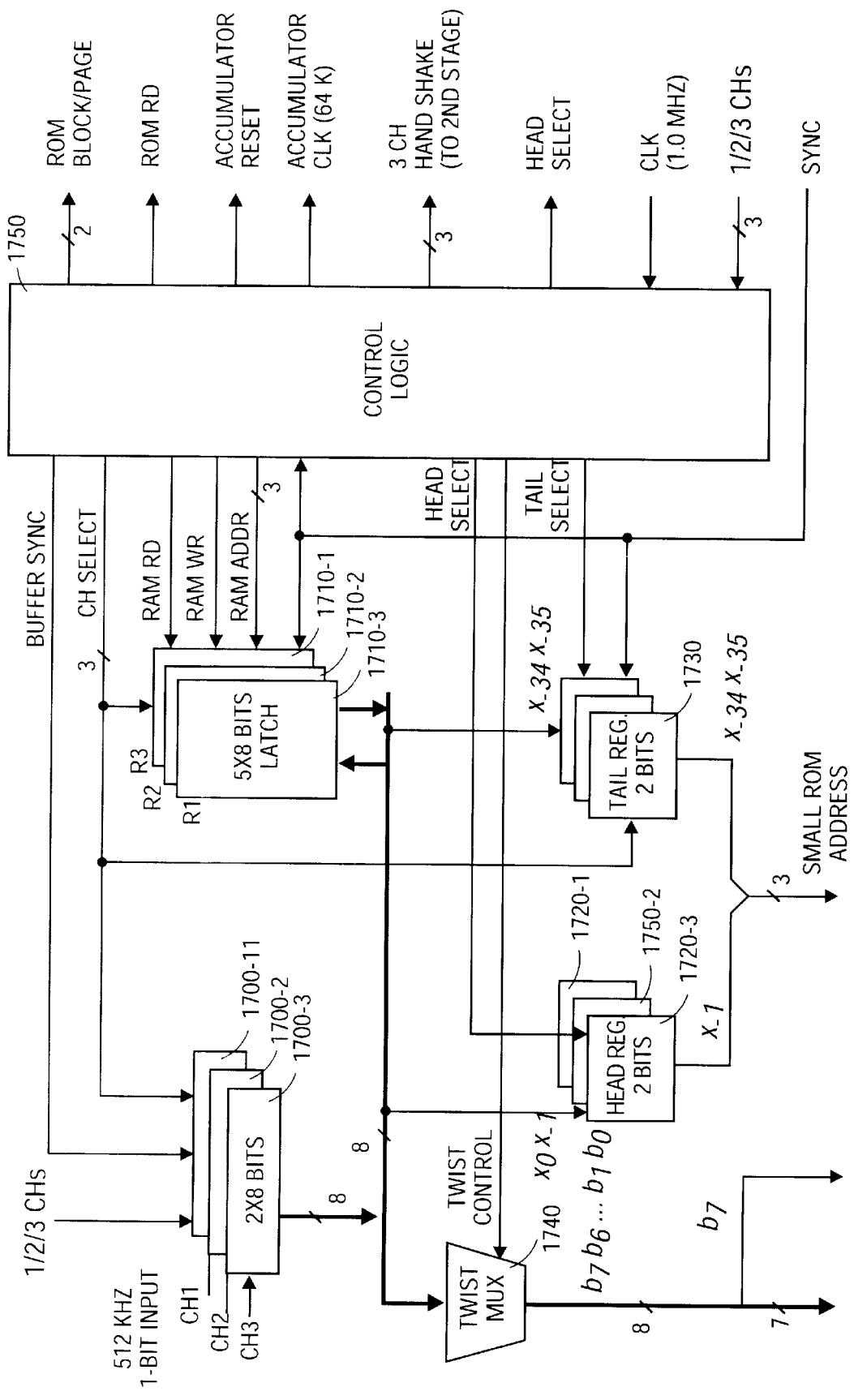
FIGS. 17A and 17B together illustrate hardware preferably utilized to implement the sinc filter Sinc#1 shown in FIG. 14.
Figure 17B:
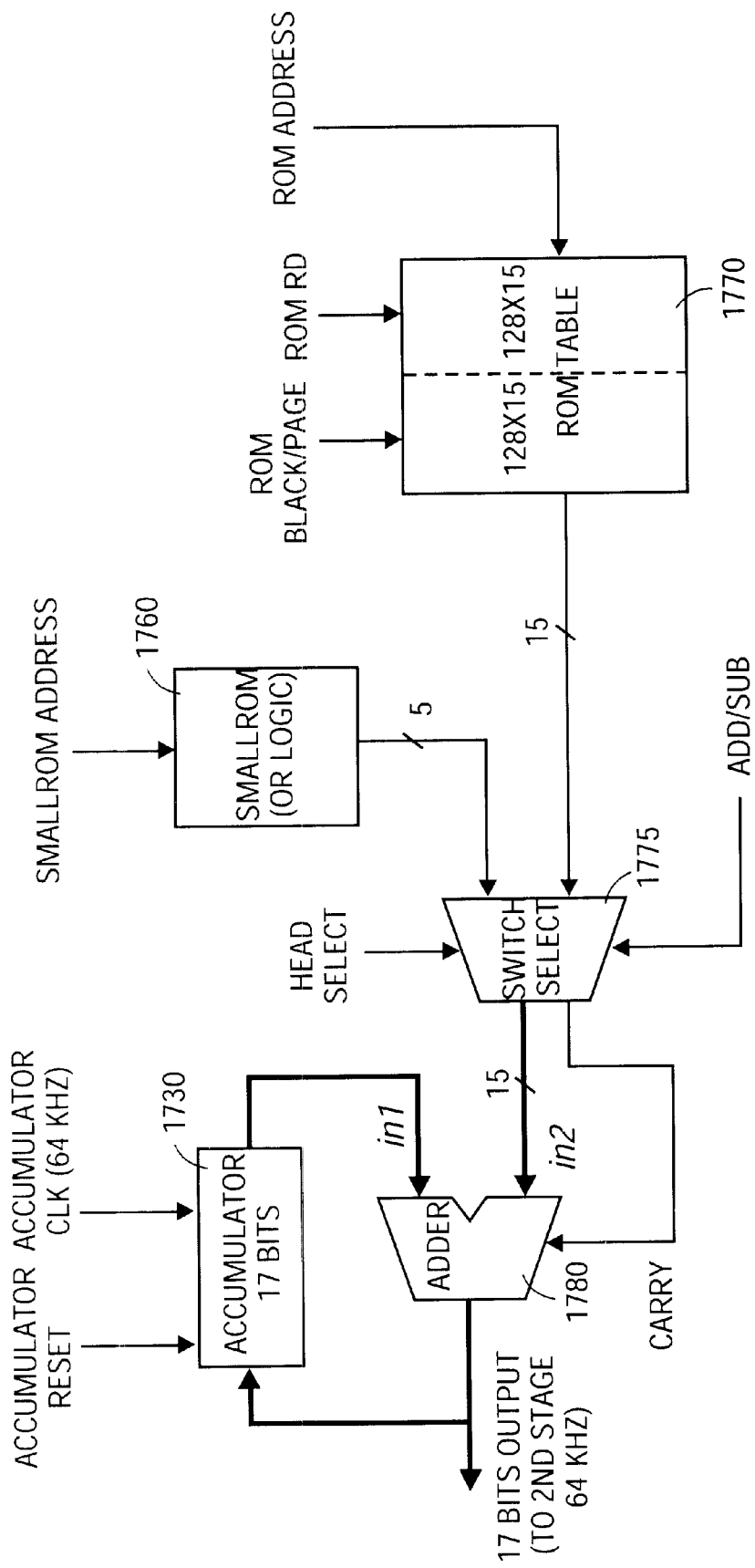

FIGS. 17A and 17B together illustrate hardware preferably utilized to implement the sinc filter number 1 shown in FIG. 14. Returning momentarily to the modulator data interface 730 of FIG. 7, the three data inputs MDATA (1), MDATA (2) and MDATA (3) are applied to the modulator data interface. These inputs correspond to the channel 1 (CH1), channel 2 (CH2) and channel 3 (CH3) inputs to respective buffers 1700 (e.g., 1700-1, 1700-2, 1700-3). Words stored in buffers 1700 are transferred to respective pages of RAM 1710. The head and tail values are written to respective head and tail registers 1720 and 1730. The combined values from the head and tail registers of a given data plane are combined to form a small look up table address, which in the example shown, is a ROM address which is utilized as shown in FIG. 17B. Similarly, the words stored in a particular data plane 1710 are read out and passed to a large look up table (a ROM in the example illustrated) in either regular or twisted form to facilitate the lookup. Twisting of the word is accomplished in a twist multiplexer 1740 which passes data either in regular or bit reversed order to the output depending on the value of the twist control input. Control logic 1750 provides control signals to portions of the chip shown in FIG. 7 and to the second stage sinc filters. A sync signal is received which specifies time zero for purposes of establishing sample intervals. Thus, the reading and writing of data will be based on the same sample intervals as the remainder of the chip. A three channel handshake is utilized to indicate a request has been received (data ready) and to receive back an acknowledgement (when no error occurs). A head select line permits early storage of the head portion of the register bits so that it will be available when needed in processing. A small ROM address and the ROM address from FIG. 17A are applied respectively to small ROM 1760 and large ROM 1770 of FIG. 17B. The lookup table output values are selectively applied to an adder via switch multiplexer 1775 which selects the input value to be passed to adder 1780 in accordance with incoming control signals. The output of 1780 is fed back to the input via an accumulator 1790. In this manner, the outputs y0, y1, y2, y3 and y4 as discussed in FIG. 16 are combined and passed as a 17-bit output to a second stage sinc filter at a 64 KHz rate.

The second stage sinc filters include sinc#2, sinc#3 (1), sinc#3 (2), sinc#4 and sinc#5. The mathematics for expressing each of these filters is set forth in FIGS. 18A and 18B. Each of those sinc filters is implemented using a number of words and a number of additions.

Figure 18A:
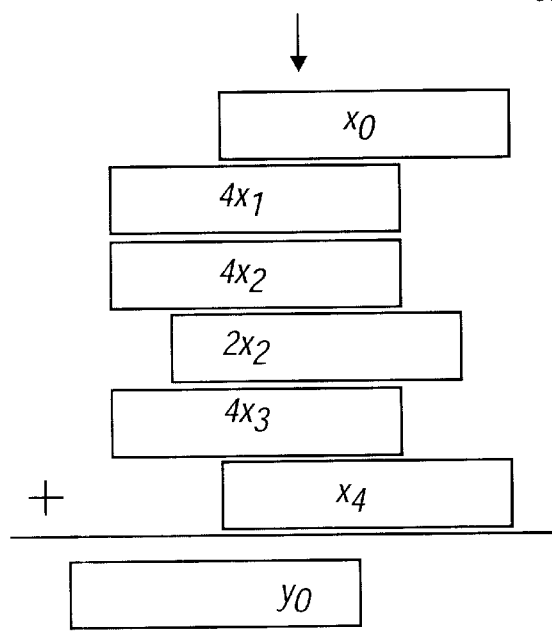
FIG. 18A symbolically illustrates the operations of shifting and addition utilized in carrying out implementation of sinc filters sinc#2 shown in FIG. 14.

FIG. 18A symbolically illustrates the operations of shifting an addition utilized in carrying out implementation of sinc filters #2–#5 shown in FIG. 14. In the drawing, each binary bit $x_i$ is multiplied by a coefficient which is a power of 2. Multiplication by a power of 2 is equivalent to a shift by a number of places equal to the exponent of the power. When a coefficient has a value which cannot be expressed as an even power of 2, it is decomposed into two terms which when summed together result in the appropriate value for that term. As shown in FIG. 18A, for sync 2, the third term has a coefficient of 6, which is not an even power of 2. However, as shown in the dashed box in the right hand part of the equation for sinc#2, a coefficient of 6 can be stated as $4*X_{-2}+2*X_{-2}$. This term is thus equivalent to $6*X_{-2}$.

FIG. 18B shows the expressions which can be used to implement sinc filters sinc#3–sinc#5.

Figure 19A:
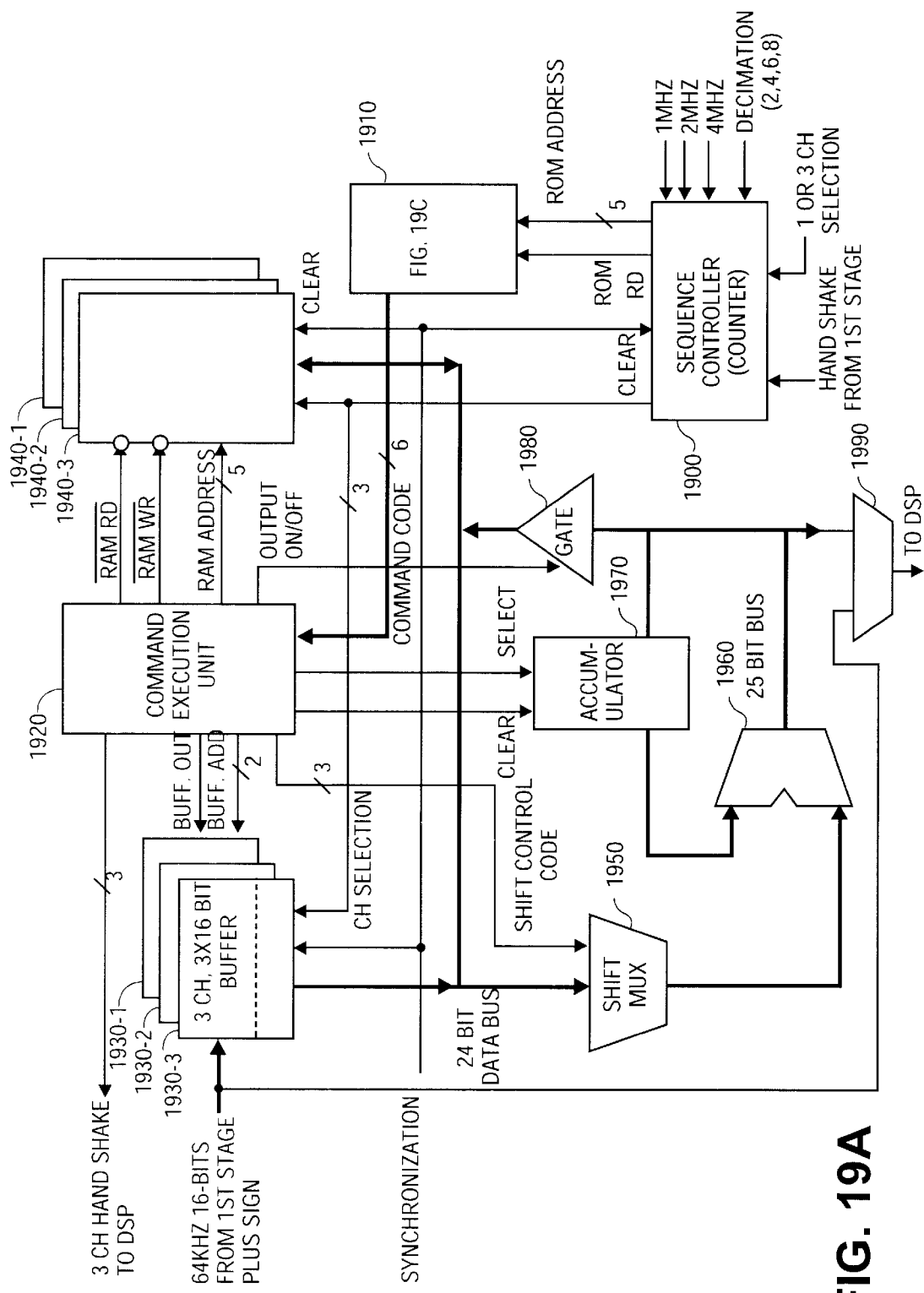
FIG. 19A is a block diagram of a single-control, multiple datapath architecture utilized in implementing sinc filters sinc#2 through sinc#5 of FIG. 14.

FIG. 19A is a block diagram of a single-control, multiple datapath architecture utilized in implementing sinc filters sinc#2 through sinc#5 of FIG. 14. The shifting and the additions necessary to implement a particular sinc filter as discussed in conjunction with FIGS. 18A and 18B are implemented in the circuitries shown in FIG. 19. A sequence controller 1900 receives the handshaking from the first stage as previously discussed, a signal indicating whether one or three channels are implemented, clock rate to be used and a decimation factor. A plurality of commands are read from the command table such as ROM 1910 and the commands sequentially read out are applied to the command execution unit 1920. The 16 kHz 17-bit signals from the first stage comprising a 16 bit value and a sign bit are applied to respective data planes 1930-i which act as incoming buffers. As the respective words emerge from the buffer, they are stored in respective individual pages of RAM 1940. As individual words are read out of individual data planes 1940, they are applied to shift multiplexer 1950 where they are selectively shifted in accordance with the shift control code applied to the mux and applied to one input of adder 1960. As before, the output of the adder is applied to the input of an accumulator 1970 and that output is applied to a second input of the adder. The output of the adder can either be recirculated over gate 1980 or applied as a 24-bit output to the digital signal processor over mux 1990. By controlling the sequence of the data circulation, in a pipeline arrangement, one can implement the multiple sinc filters needed for a particular decimation ratio. Thus, the second stage shown in FIG. 14 can be implemented using the arrangement shown in FIG. 19.

Advantages of the single-control multiple datapath are:

A. Gate clocks to each datapath independently allows unused channels to be turned "off" for low power.

B. Run the complete block at a lower clock rate than for a design where a single datapath is used for multiple channels. This provides a linear reduction in clocks. (i.e. if 3 channels on 1 datapath require 1 MHZ, then 3 channels on 3 datapaths can be done in 1 MHZ0.3=333.3 kHz.)

C. Arbitrarily add or remove channels to the design very easily with no modification to the control.

D. All channels generally are guaranteed to run the same code, so writing the code is easier (only consider 1 channel, not 3), and the multiple channels don't need to be interleaved in time (i.e. don't need to split code for ch 1, ch 2, ch 3 and so on).

E. The code for each channel must still be interleaved with the incoming data to spread out the computations so that the minimum clock frequency can be used.

Figure 19B:
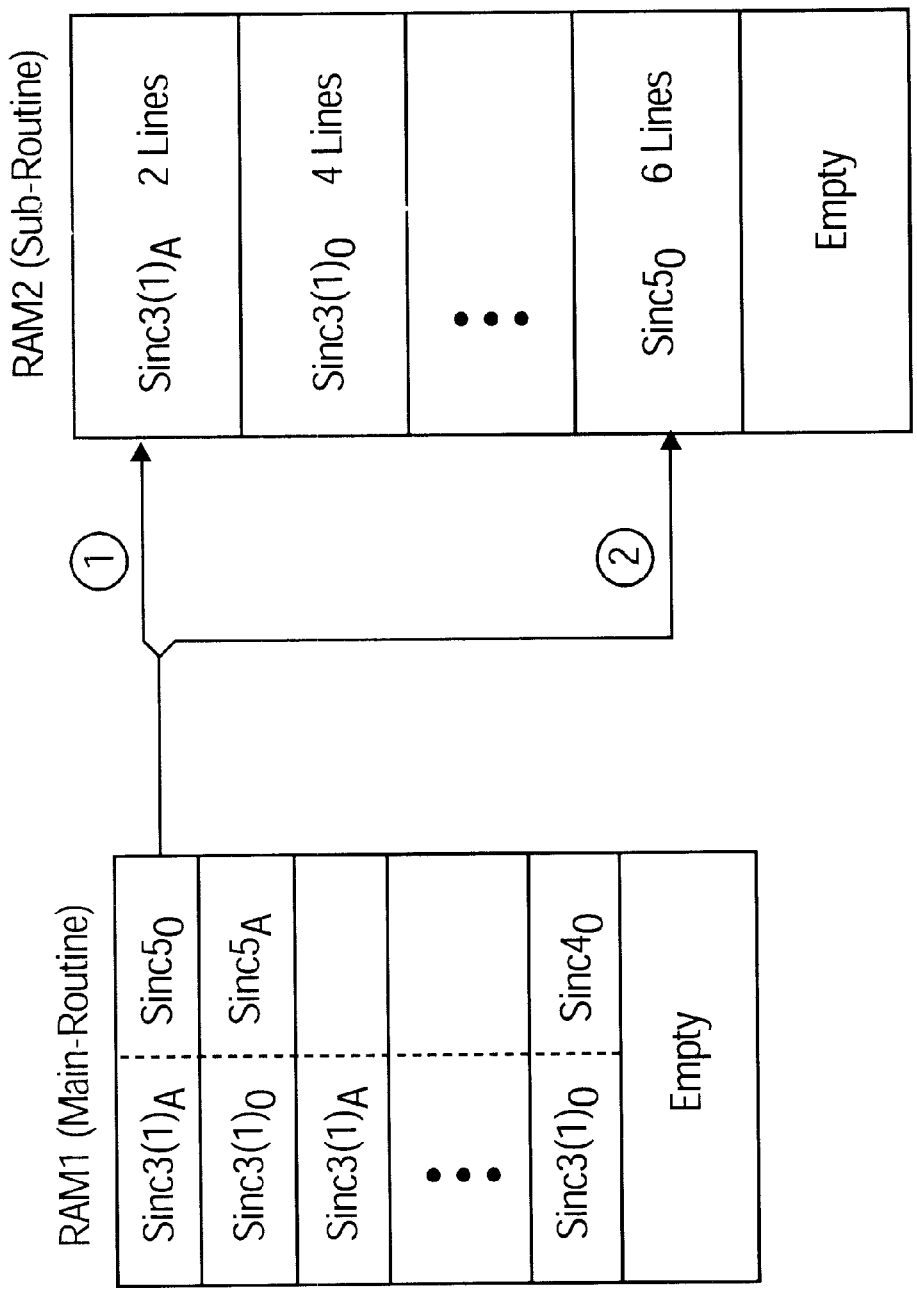
FIG. 19B shows programming or logic used in item 1910 of FIG. 19A.

FIG. 19B shows programming or logic used in item 1910 of FIG. 19A. The example shown in FIG. 19B follows the ordering needed to implement the A–O mode multiplexing discussed hereinafter in conjunction with FIG. 21C. If implemented in logic, there is a main routine, each activated by one of eight command lines. The main routine calls subroutines, in this case, also implemented in logic. In the example shown in line 1 of the main routine, there are two subroutine calls, the first to sinc 3 $(1)_A$ and the second to sinc $5_O$. Each of those routines is implemented in the subroutine logic or an equivalent RAM. The subroutine sinc $3(1)_A$ comprises two lines of microcode implemented in logic and the subroutine sinc $5_O$ comprises six lines of microcode implemented in logic.

Figure 20:
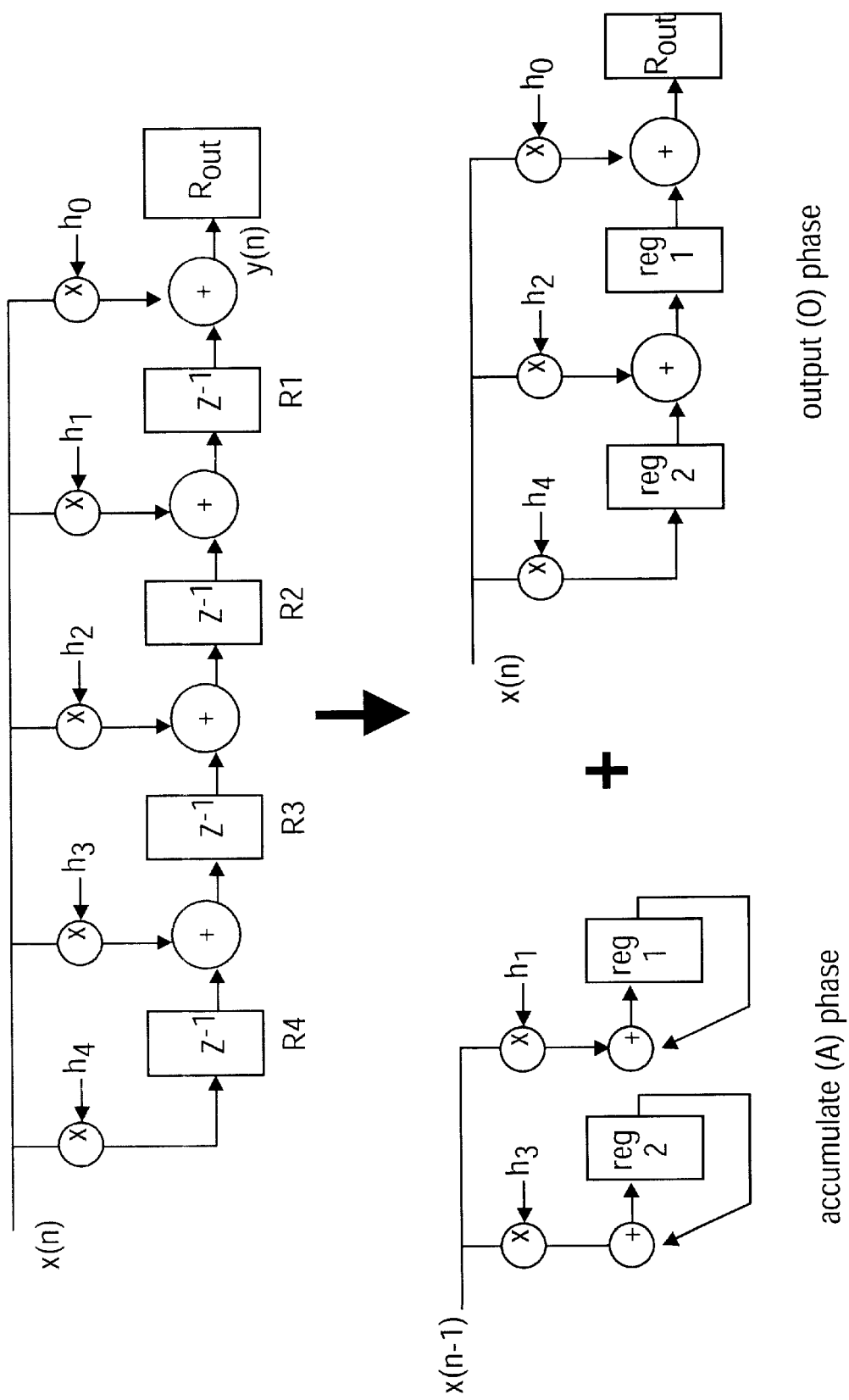
FIG. 20 is a block diagram showing how a linear phase FIR sinc filter can be improved by decomposition of the calculations into two stages.

FIG. 20 is a block diagram showing how a linear phase FIR sinc filter can be improved by decomposition of the calculations into two stages. It is possible to reduce the hardware requirements and the calculation rate needed for implementing a particular sinc filter by splitting the processing across two stages. This principle is illustrated in FIG. 20 in which a data value is multiplied by a respective set of coefficients and their values delayed and summed with subsequent products. If the process shown at the top half of FIG. 20 where to be separated into two phases, namely first an accumulate phase (A phase) and then an output phase (O phase), as shown in the bottom half of FIG. 20 the total number of registers needed can be reduced from 4 to 2 resulting in considerable power savings and in savings of silicon real estate.

Figure 21A:
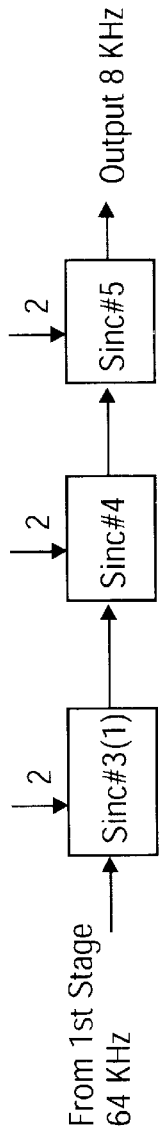
FIG. 21A illustrates a factor of eight decimation such as might be utilized in one configuration of the circuitry of FIG. 14.

FIG. 21A illustrates this principle using a factor of eight decimation such as might be utilized in one configuration of the circuitry of FIG. 14. The pipeline shown in FIG. 21A will be used as an example comparing the calculation requirements at various points in time using the techniques described herein.

Figure 21B:
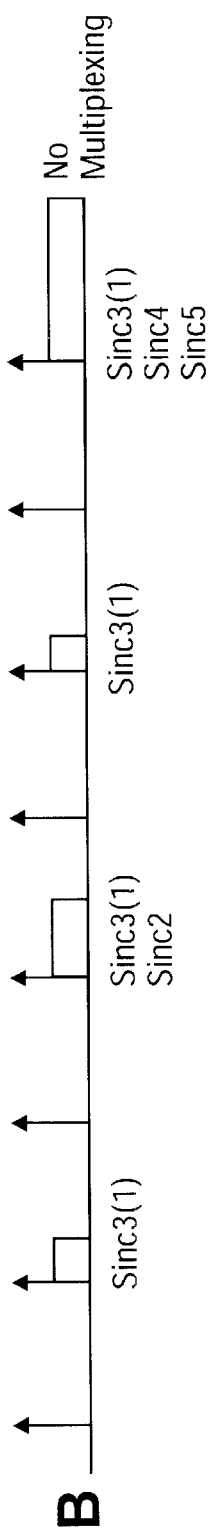
FIG. 21B shows the calculations required to carry out the factor of eight decimation shown in FIG. 21A.

FIG. 21B shows the calculations required to carry out the factor of eight decimation shown in FIG. 21A. One can see that various amounts of calculation occur at alternative sample instances when no multiplexing is employed. That is, calculations are fairly intensive at one instant but nonexistent at another instant. Even during those instances in which calculation occurs, the amount of calculation varies from sample instant to sample instant. The clock rate must be high enough to handle the largest number of calculations per sample insert.

Figure 21C:
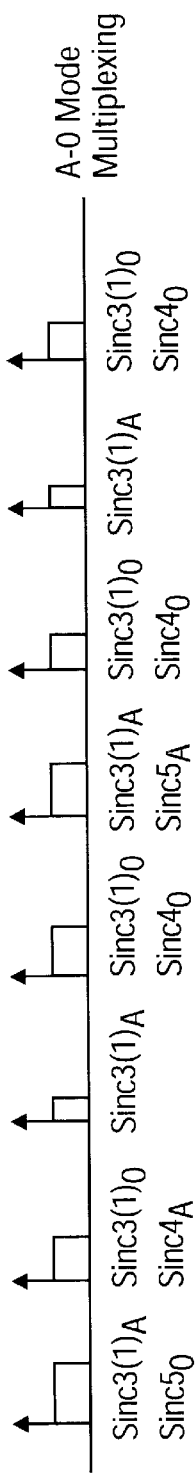
FIG. 21C shows an improved allocation of calculations resulting from the decomposition of FIR processing into two stages as discussed in conjunction with FIG. 20.

FIG. 21C shows an improved allocation of calculations resulting from the decomposition of FIR processing into two stages as discussed in conjunction with FIG. 20. Using the A–O mode of multiplexing described in conjunction with FIG. 20, the amount of calculation is spread out over all instances but the peak amount of calculation required is considerably reduced. Since the peak amount of calculation is reduced, the clock rate can be reduced, saving power.

Figure 21D:
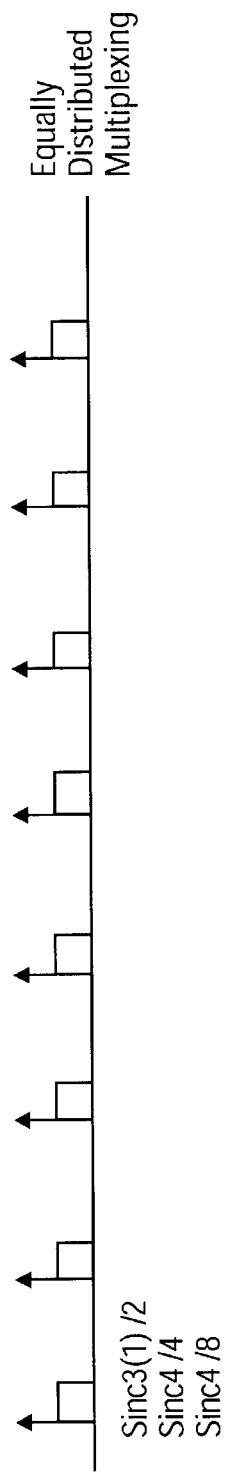
FIG. 21D shows a further improvement in processing allocation resulting from equalization of calculation across sampling instances.

FIG. 21D shows a further improvement in processing allocation resulting from equalization of calculation across all sampling instances. Here, each sample instant has an identical amount of calculation going on. The architecture of the second stage sinc filter as shown in FIGS. 19A–19C, permits each of these options to be implemented as desired.

Because of the flexibility of that architecture, any of the approaches shown in FIG. 21B, 21C or 21D can be carried out.

If one were to estimate the calculations required for the different sinc filter approaches shown in FIGS. 21B, 21C and 21D, assuming that an equivalent computation rate was equal to the sample frequency times the number of additions, times three channels, where one addition means one 24-bit addition/subtraction, one would observe the following results.

|  | R = 16 | R = 32 | R = 64 | R = 96 | R = 128 |
|---|---|---|---|---|---|
| CIC DIRECT STRUCTURE | 9,792 | 10,656 | 10,512 | 11,616 | 11,592 |
| CIC CASCADE STRUCTURE | 10,080 | 8,034 | 7,458 | 5,836 | 5,673 |
| FIR STRUCTURE | 1,832 | 2,216 | 2,024 | 2,024 | 1,928 |

One can see that the inventive linear phase FIR filter structure implementation described above results in a greatly reduced computation rate when compared with direct or cascade CIC structures. The reduced calculations will result in significant power savings.

Figure 22:
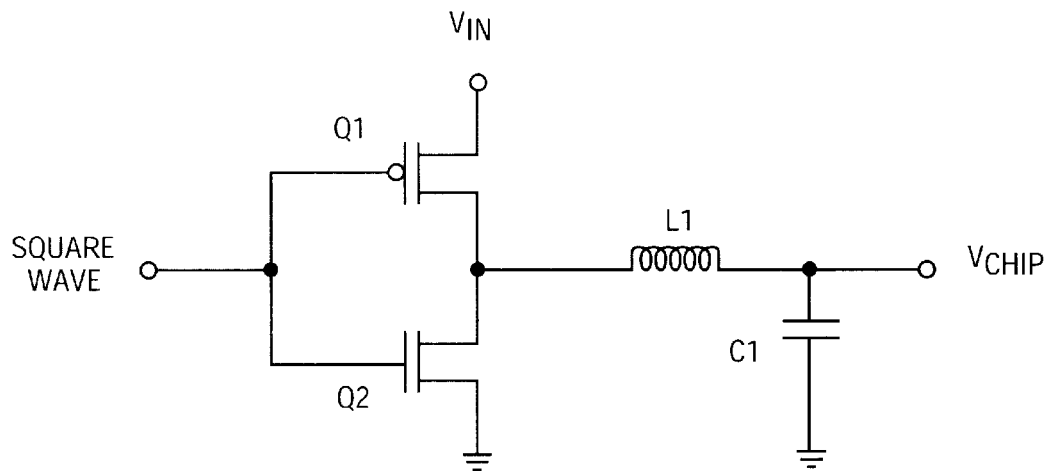
FIG. 22 shows a switched power converter of a type known in the prior art.

Additional power savings can be achieved through the construction of regulator/switched converter 770 shown in FIG. 7. Switch converters are known in the art. One such switch converter is described in an article entitled "HIGH-EFFICIENCY LOW-VOLTAGE DC—DC CONVERSION FOR PORTABLE APPLICATIONS" by Anthony J. Stratakos et al. of the University of California at Berkley and described at pages 105–110 of the IWLPD '94 Workshop Proceedings. FIG. 22 shows a switched power converter of a type described in the article. A square wave input is applied in parallel to the gates of a PMOS and NMOS device. The PMOS and NMOS devices are connected in series. An output from the junction of the drain and source of the PMOS and NMOS devices is applied to an inductor L1 and the other end of the inductor is provided to a smoothing capacitor C1 and an output line to provide voltage for the integrated circuit chip.

Figure 23:
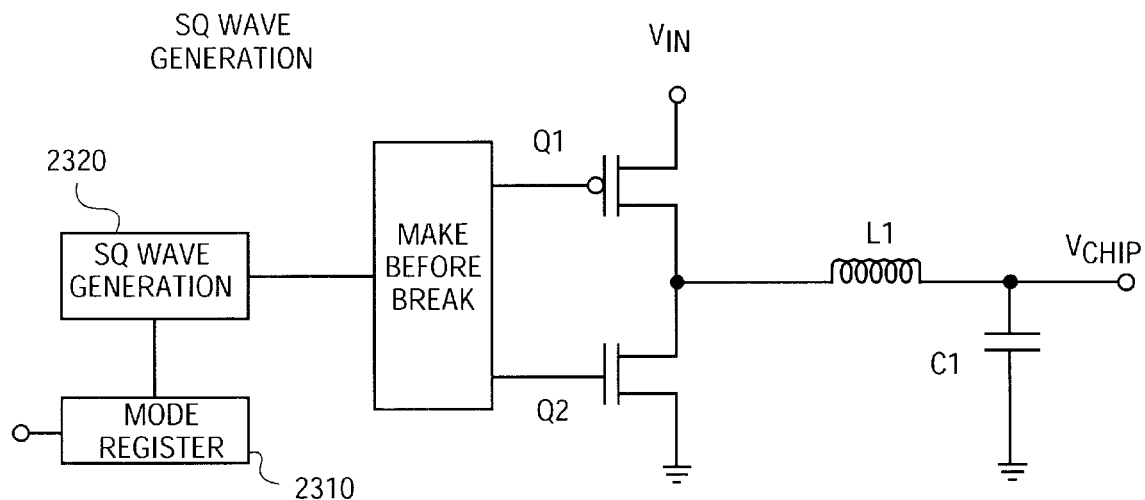
FIG. 23 shows an improved switched power converter in accordance with the invention.

FIG. 23 shows an improved switched power converter in accordance with the invention. In accordance with the invention, the prior art switching convertor is modified by inclusion of a break before make circuit 2300. This ensures that none of the devices is turned on substantially completely before the other device is turned off, thus avoiding switching problems of the prior art and their accompanying power consumption.

Figure 24:
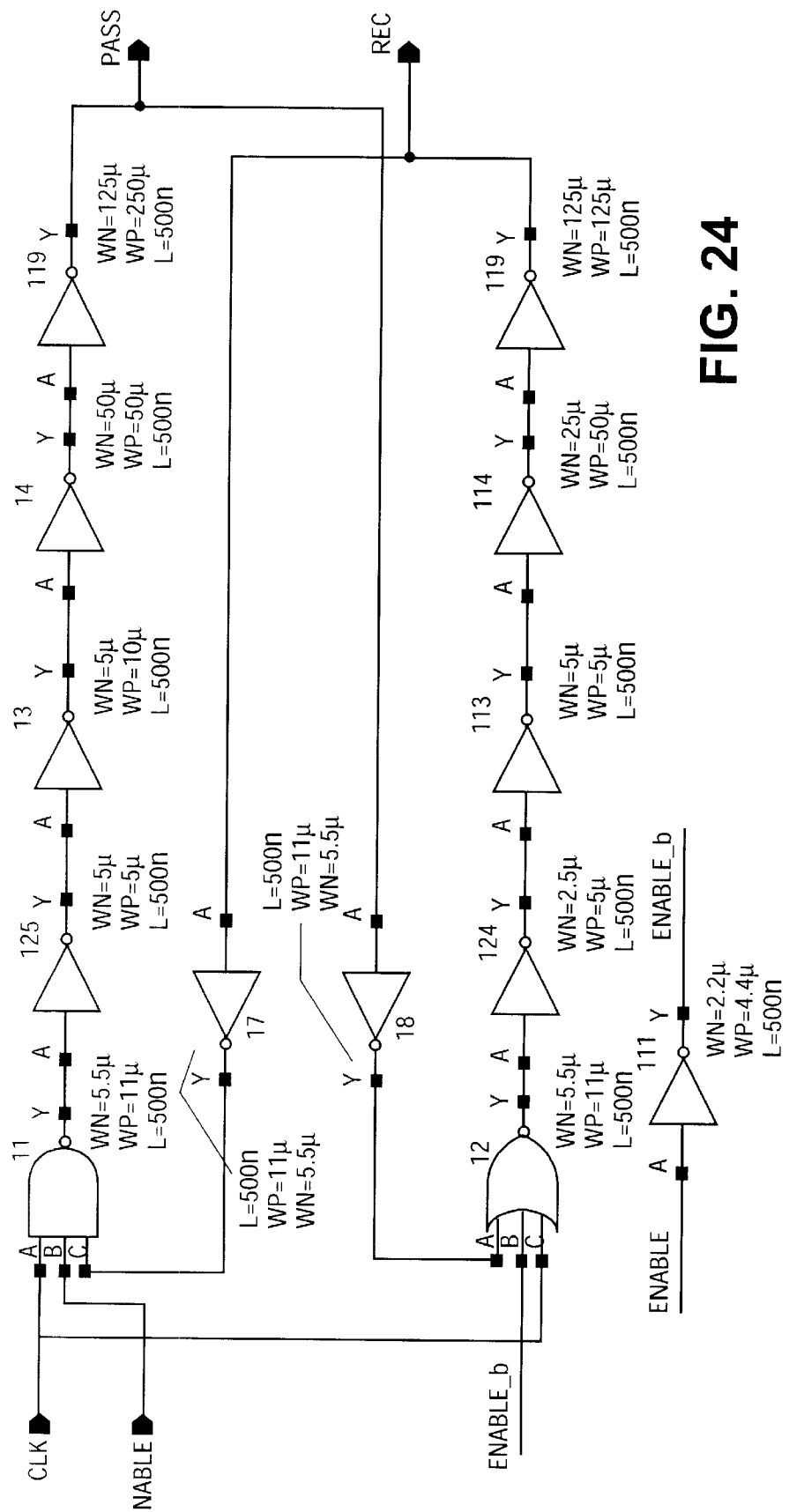
FIG. 24 is a schematic diagram of an exemplary break before make circuit of FIG. 23.

The implementation of this break before make circuit 2300 is shown more in detail in FIG. 24. The clocking input is applied to a NAND gate I1 and a NOR gate I2. The A input on each gate is inverted. The output of the gates I1 and I2 drive respective chains of inverters, the output of which is fed back to one of the inputs of the gates by inverters I7 and I8, respectively. Thus, when enabled, the circuit of FIG. 24 ensures that one of the two series transistors of the switched converter is opened (turned off) before the other is closed (turned on).

The circuit shown in FIG. 23 has yet other benefits of that shown in the prior art. As shown in FIG. 23, the square wave generator 2320 which drives the break before make circuit 2300 is controlled by a mode register 2310. The mode register permits the chip voltage to be set by commands sent over the command link 200 and applied to the regulator/SC converter over the TMI bus shown in FIG. 7. The value in the mode register controls both the duty cycle of the square wave, which permits the output voltage $V_{chip}$ to be set, as well as the phase of the square wave generated. The ability to adjust and control the phase of the square wave is particularly critical because the switching generated by the switched converter has a sharp rise time and fall time which translate into relatively high frequency components which can be coupled easily as noise into other circuits. By being able to control the phasing of the square wave, the noisy transition instants in the switching converter can be set to occur at a time when sensitive signal processing functions are not going on. For example, during charge transfer using a switched capacitor input circuit to sample the analog output value of a seismic sensor, one would prefer to have as little noise as possible in the neighborhood. The switching transition instance for the switch converter can be set so as to occur when such sensitive charge sampling operations are not occurring. The power on reset circuit shown in FIG. 7 of the drawings applies to protocol which is advantageous in ensuring correct startup of the chip.

Figure 25:
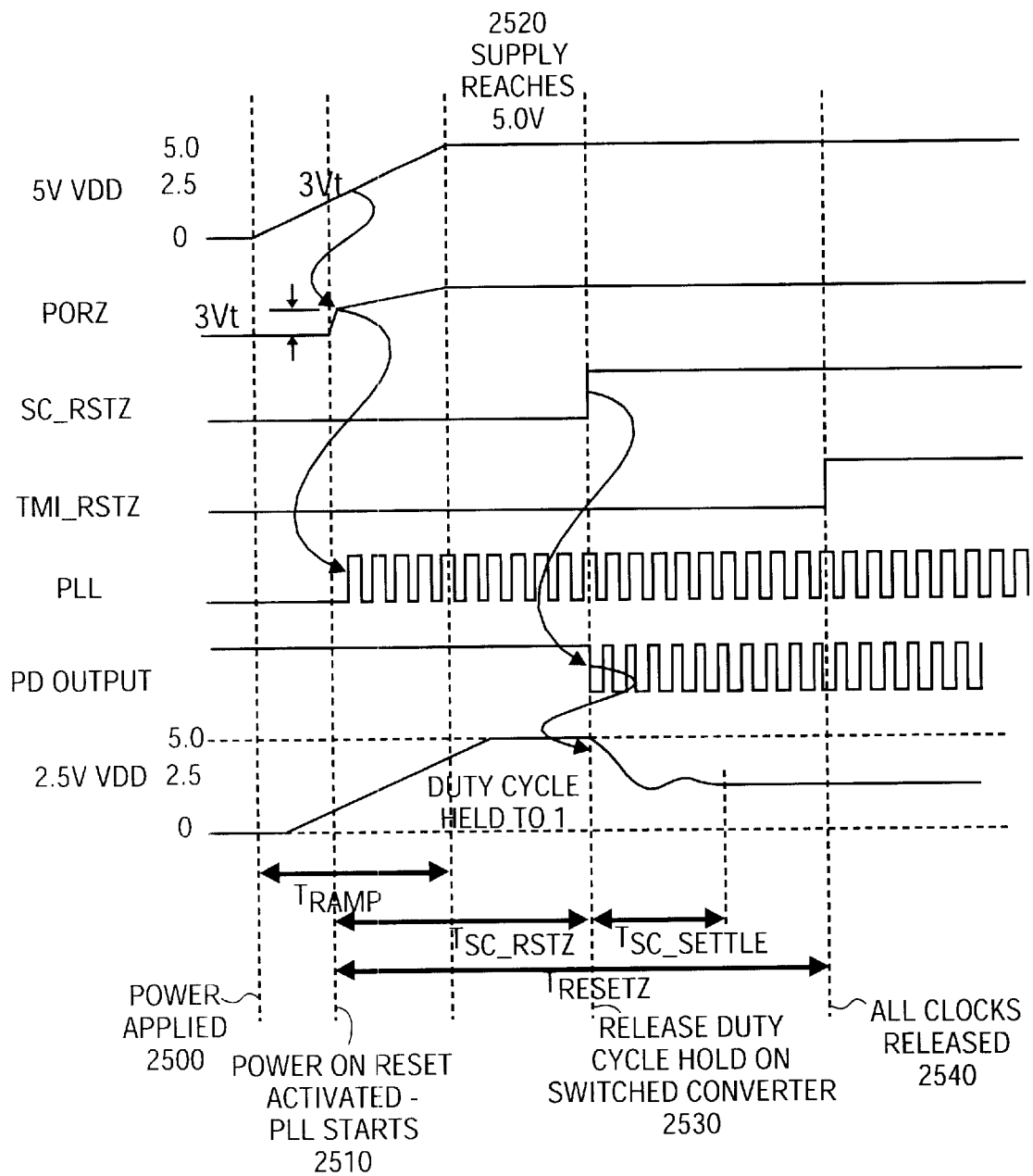
FIG. 25 is a timing diagram showing a protocol suitable for use during power on reset when using a switched converter power source.

FIG. 25 shows a set of timing diagrams which describe that operation. When the 5 volt VDD is first applied (2500) it rises from 0 volts to its supply value of approximately 5.0 volts. Once the value of the applied VDD rises to a point which exceeds three times the threshold voltage of the devices in question, the power on reset circuit is activated (2510) and the phase locked loop begins its oscillation. When power is first applied, the duty cycle for the switched converter is held to unity, that is, it is always on. Thus, the output voltage of the switched converter rises above its 2.5 volt VDD line and reaches 5.0 volts (2520). After the output of the switched converter is stabilized at 5 volts, the duty cycle hold on the switched converter is released and the switched converter seeks the output value programmed for it by the mode register (2530) and the switched converter begins to seek its programmed value. After a time $T_{SC\_SETTLE}$, the 2.5 VDD output, or equivalent value set in the mode register, is stabilized and the hold applied to all clocks is released and the chip begins to operate.

Figure 26:
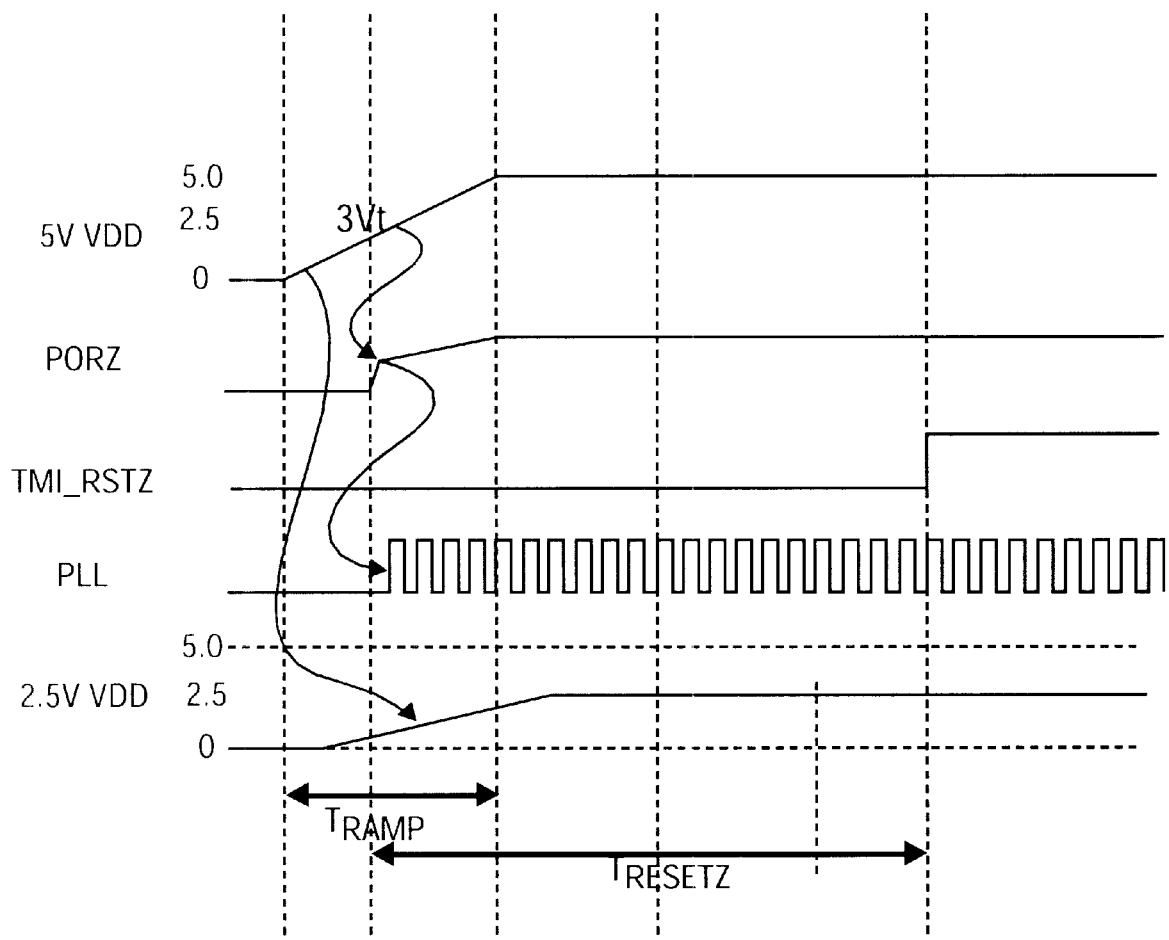
FIG. 26 is a timing diagram showing a protocol suitable for user during power on reset when using a regulator power source.

FIG. 26 shows a similar power on reset operation utilized when the power source is controlled by a regulator. However, in this case, the switched converter is not utilized but rather a regulated version of an external power source is used. The external power source functions as the 5 volt VDD line did in the discussion of FIG. 25 and time lines having corresponding labels to those shown in FIG. 25 behave as described previously. However, since the switched converter is not utilized, those time lines are not shown. In addition, the 2.5 volt VDD line begins rising gradually as plot power is applied until it reaches a stable, in this case 2.5 volt level. At that time, after expiration of time $T_{resetz}$, the hold on all clocks is released and the chip begins to function. An optional reset mode is used in a third mode which the time required for reset is reduced to a few clock cycles. This is used for testing on, for example, an industrial IC tester. This is possible because the voltage ramps on such a tester are well defined and a long time for voltages to stabilize isn't needed.

Figure 27:
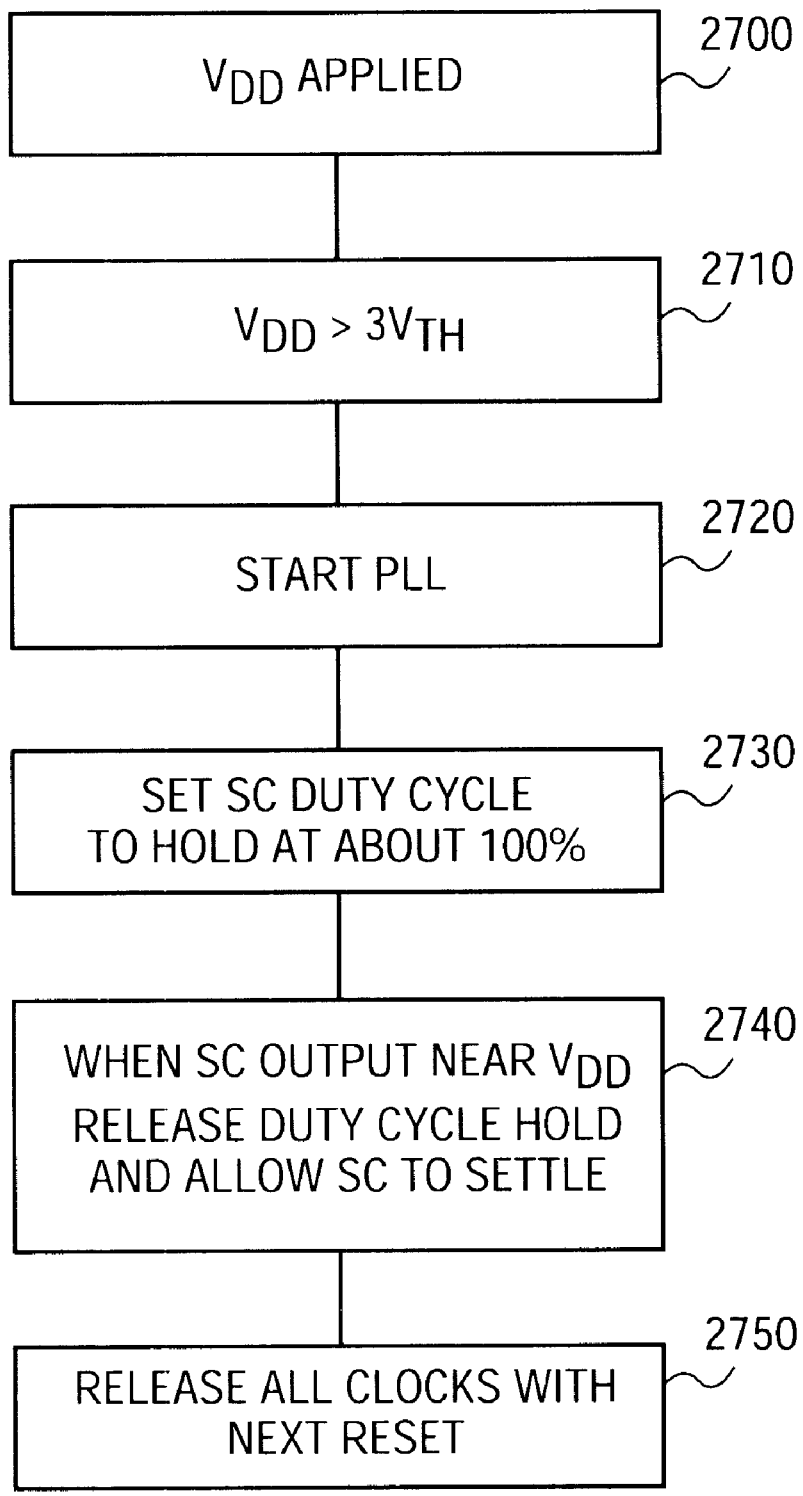
FIG. 27 is a flow chart of a process used during power on reset of a power source.

FIG. 27 is a flow chart of the process described in conjunction with FIG. 25. VDD is applied (2700) and when the applied VDD exceeds $3V_{th}$ (2710) the PLL starts (2720). The SC duty cycle is set to hold at about 100% (2730) and when the SC output nears VDD, the duty cycle hold is released and the switched converter is allowed to have settled to its nominal voltage established in the mode register (2740). Once it is settled, all clocks are released with the next clock reset pulse (2750).

The clock recovery and reset logic 725 shown in FIG. 7, contains a phase lock loop which is phase locked to the command line 1 Mbps Manchester encoding rate. In Manchester encoding, an up transition or a down transition in the center of the sample window is interpreted as a logic 1 or a logic 0. The PLL locks on to these transitions, although the output of the PLL is preferably, in this example, 16 times the 1 Mbps rate of the Manchester encoding. This 16 Mbps clock signal is utilized as a master chip clock and all clocks on the chip are derived from this clock.

It has been found particularly advantageous to generate all clocks internal to the chip so that they coincide with the rising edge of the chip clock. All noise critical clocks provided external to the chip, such as ones provided to the ADC interface 110 shown in FIG. 1 are created on the falling edge of the chip clock.

All clocks on the chip shown in FIG. 7 are programmable. That is, the division ratio used to obtain a particular clock rate from the chip clock can be programmed. Not only that, they can be programmed during the operation of the chip. The registers setting the dividers for the various clocks can be programmed over the TMI bus using information received over the command line. Thus, the central processing and recording unit 160 can set individual clock rates on the chips. The arrangement execution of a change in the programming for a particular clock can occur only when a chip sinc pulse occurs. This occurs typically at a 32 kHz rate.

Figure 28A:
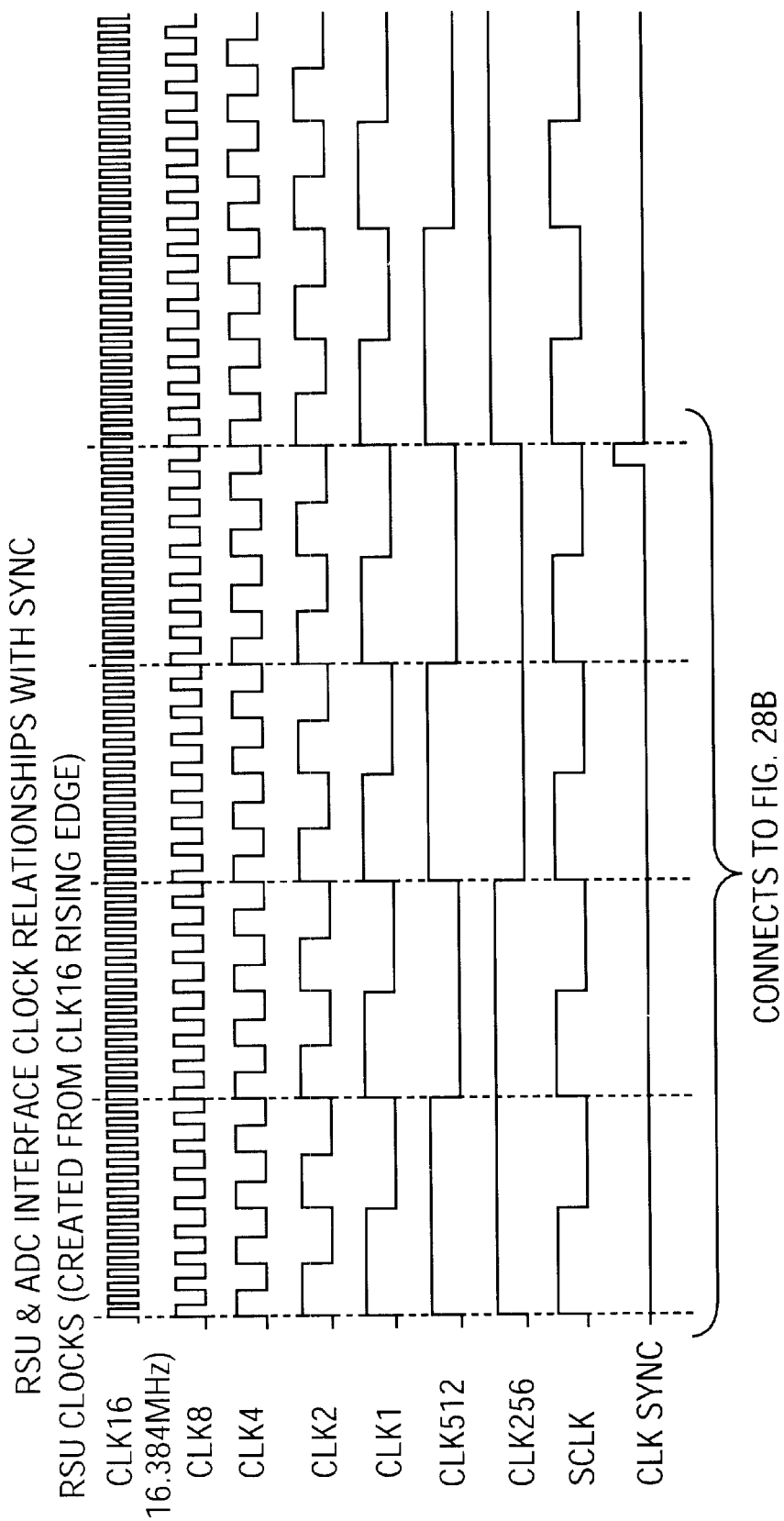
FIG. 28 shows a plurality of time lines showing clock alignment associated with on-chip generation of clocks in accordance with the invention.
Figure 28B:
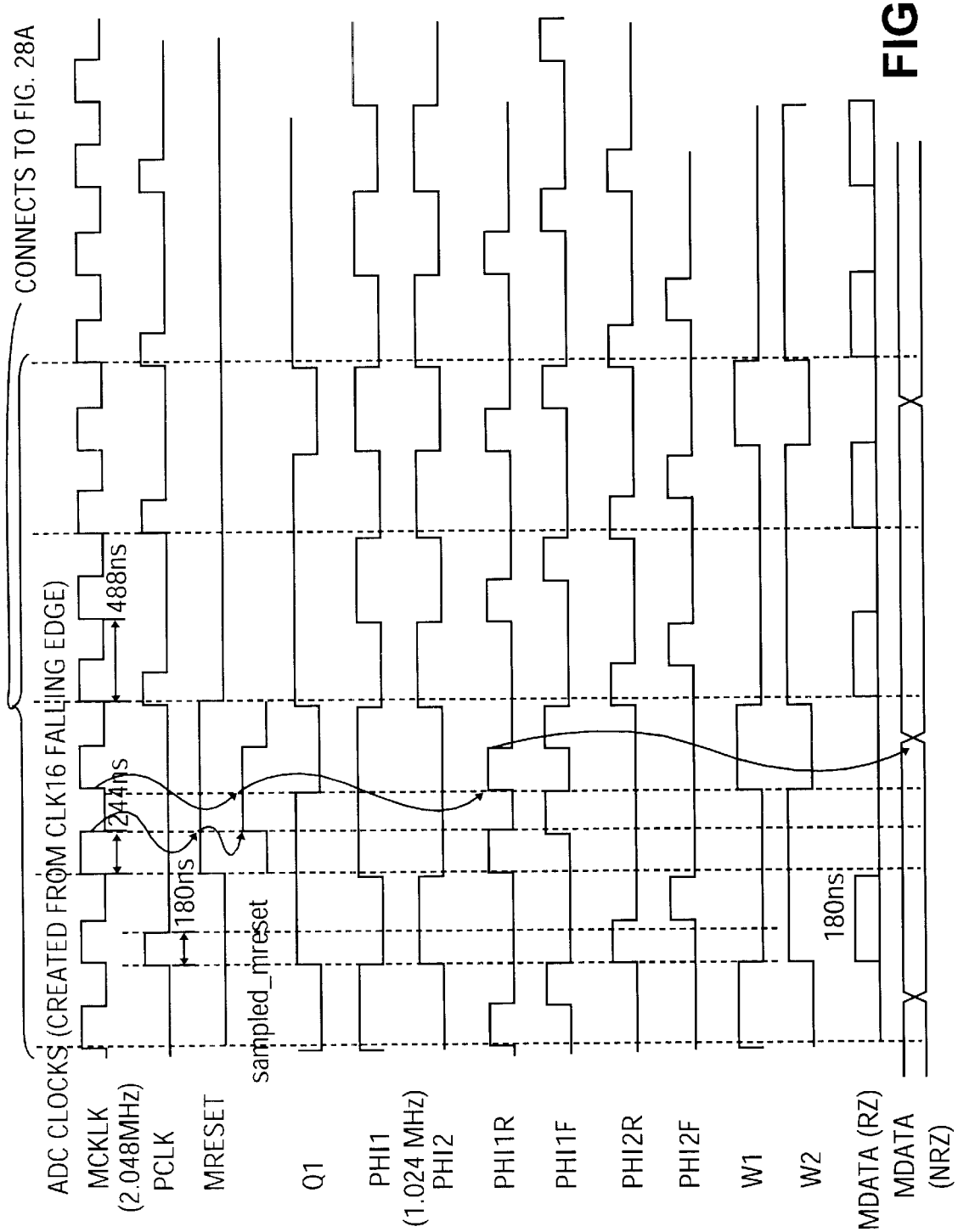

FIG. 28 shows a plurality of time lines showing clock alignment associated with on-chip generation of clocks in accordance with the invention. These time lines illustrate the principles just discussed. In FIG. 28, CLK 16 is the clock to which all other clocks are locked. A plurality of additional clocks, CLK 8, CLK 4, CLK 2, CLK 1, CLK 512 and CLK 256 are each derived from CLK 16 by a programmable division, in this case by an even power of 2. These clocks operate at 8 MhZ, 4 MhZ, 1 MhZ, 512 KhZ and 256 KhZ, respectively. In addition, an S clock signal is derived and a clock sync signal CLKSYNC occurs every 8 milaseconds which resets the clock dividers and ensures that all clocks operate in lock. A plurality of ADC clocks are shown. These clocks may be, for example, clocks associated with the ADC interface 110 shown in FIG. 1. They are utilized for controlling whatever operations might be desirable within that circuit. In this case, a plurality of different clocks are shown. However, what is important is that each of these clocks utilized with off chip devices are generated on the falling edge of CLK 16. Thus, the activities which occur on the chip shown in FIG. 7 will occur at different instances from the activities occurring on external devices. This provides considerable advantage when dealing with noise and other design issues. The synchronization of clocks on a chip, in this case for example on the RSU chip is particularly advantageous because it eases the interfacing of on chip components because of the known time relationships.

Figure 29:
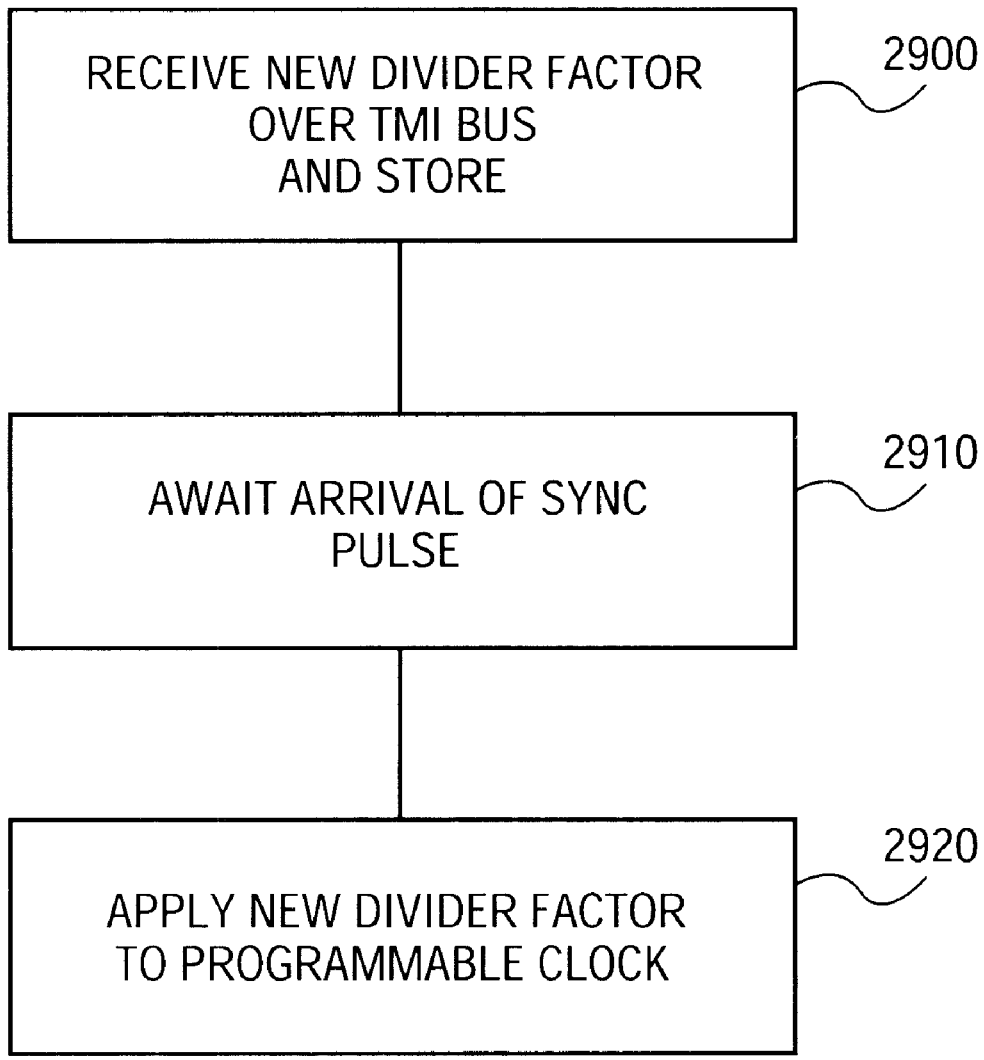
FIG. 29 is a flow chart of a process for programming clocks in accordance with the invention.
Figures 30, 31:
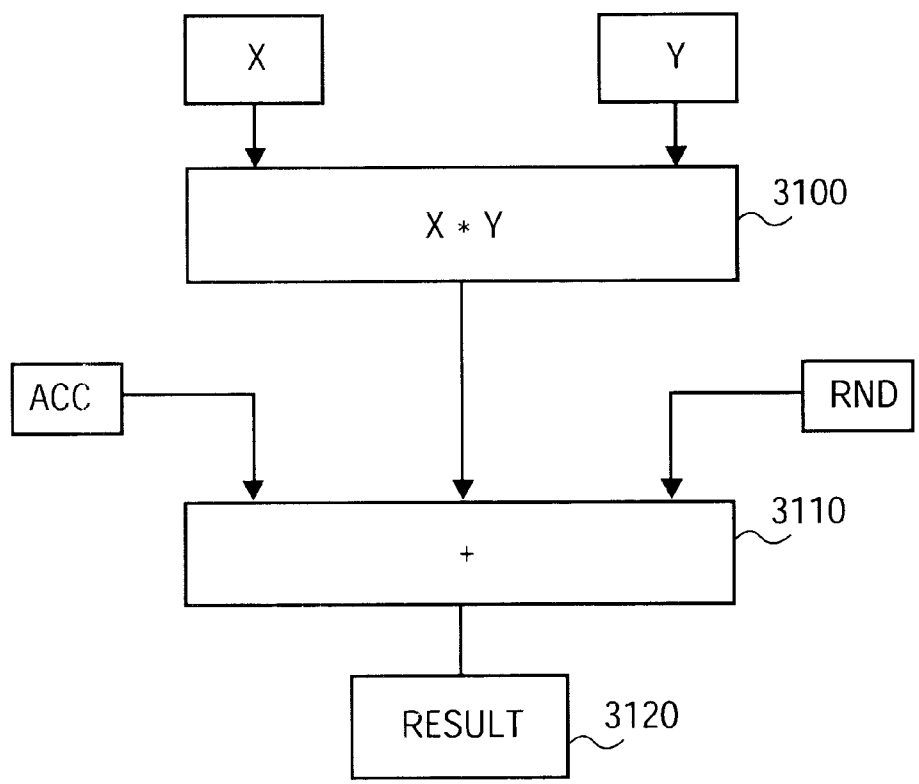
FIG. 30 is a mathematical relationship showing how a multiply and add operation using rounding is implemented.
FIG. 31 illustrates how the equation of FIG. 30 would be implemented, in block form.
Figure 32:
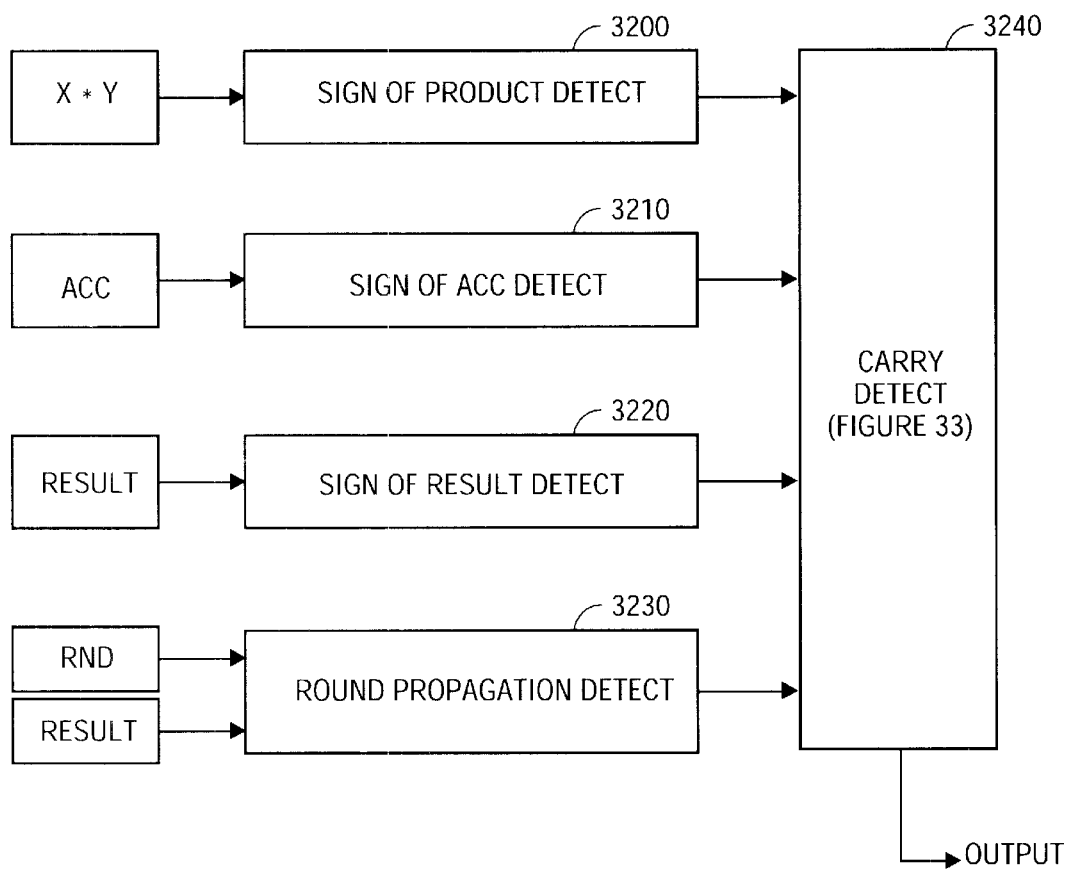
FIG. 32 is a block diagram showing the logic of how the multiply and add result of FIG. 31 is utilized for proper care detection.
Figure 33:
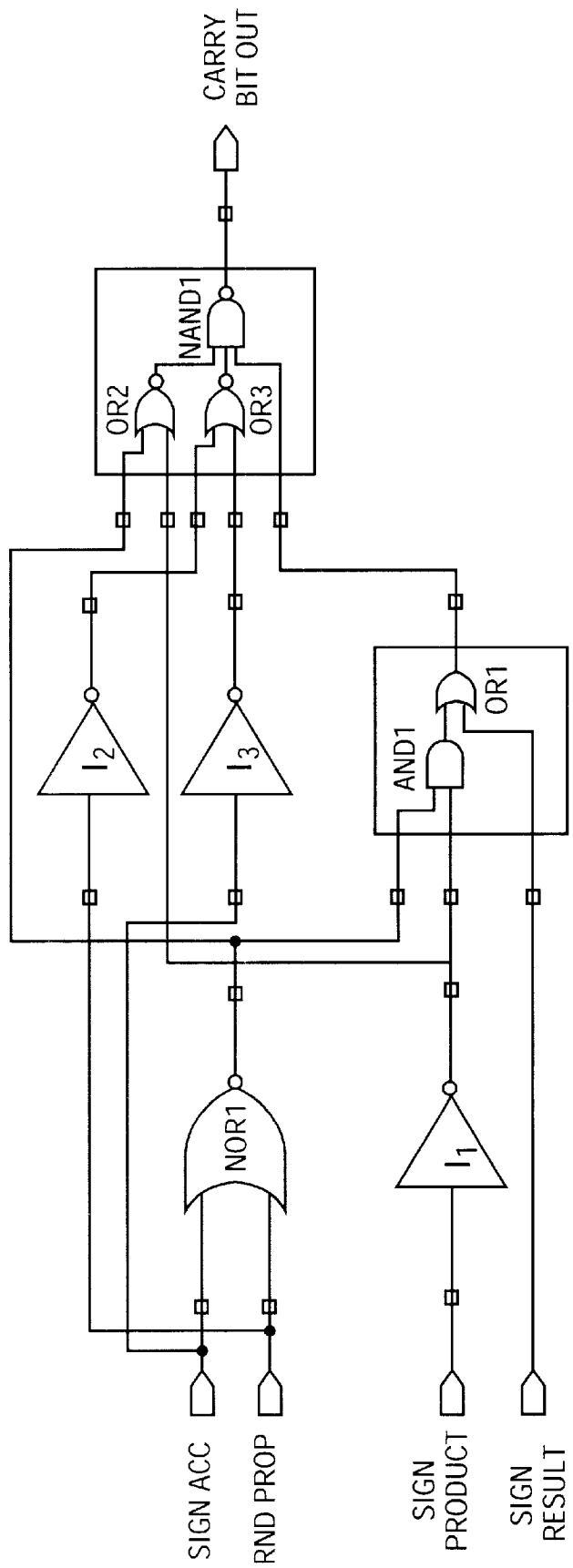
FIG. 33 is a logic diagram showing the implementation of carry detect circuit 3240 shown in block form in FIG. 32.

FIG. 29 is a block diagram showing how clock reprogramability is implemented in accordance with the invention. This process is described in conjunction with FIG. 28 in which a 16 megabit per second chip clock is provided to a programmable divider 2900 which divides the clock down to a local chip clock frequency 2910. A register 2920 is connected to the TMI bus 705 so that the value in the register 2920 can be programmed from the TMI bus. However, the revised value in the register 2920 cannot be applied to the programmable divider 2900 until the occurrence of a sync pulse 2930.

By switching the programming of a clock during the sync pulse, the clock can be reprogrammed during operation without cause causing glitches in the data. Further, data interfacing among devices on the chip is easier when all clocks on the chip are synchronized.

A problem exists when implementing mathematics in the DSP. The problem is that many adder circuits do not correctly determine a carry bit. In accordance with the invention, a carry detection circuit has been developed which can detect correctly the carry bit of X*Y+Accumulator+round. X*Y+Accumulator has been called MAC traditionally. Previous work has been addressed to X*Y+Accumulator. However, with rounding, the circuit is not obviously correct and is, in fact, many times incorrect because the intimediate values are scrambled. The carry detection circuit described here overcomes this problem.

The following 5 steps are undertaken in order to determine the carry bit correctly.

1. Determine if product is negative.
2. Determine if accumulator is negative.
3. Determine if the round-bit propagates all the way to the most significant bit, MSB.
4. Determine if result (X*Y+Accumulator+round) is negative.
5. Determine a correct carry bit (based on previous 4 results).

The actual circuit implementation of the previous steps are described as follows.

```
1.      negative product bit:                       (proof 1)
(multinA[MSB] ^ multinB[MSB]) && |multinB && |multinA
multinA  :    an N-bit 2's complement number
multinB  :    an N-bit 2's complement number
MSB      :    "Most Significant Bit" i.e. bit N-1
              Note: one counts bit 0, bit 1, . . . bit N-1.
              Thus, the number of bits is equal to N,
              but the most significant one is bit N-1.
    ^    :    logical XOR operation
    &&   :    logical AND operation
    |    :    bitwise logical OR operation
              e.g. |multinB means multinB[N-1] OR multinB[N-
         2] OR. . .
              . . . OR multinB[0]
2.      negative accumulator bit:
acc[MSB]
acc      :    2's complement number of Accumulator
              Note that acc has > 2N bits to store results
         of
              previous multiplications.
                 e.g. 1010 * 0101 = 11100010
         thus, 4-bit number * 4-bit number becomes 8-bit
number.
         It is a property of 2's complement number that the
MSB is
         the sign bit.
3.      round-bit propagates to MSB bit:           (proof 3)
Let i be the bit that round is added to accumulator
output
rndprop (round-propagate) bit :
    round && (result[MSB:I] all zero)
result    :    X * Y + Accumulator + round
round     :    user can choose to round or not. 1 means
yes,
                   0 means no
i         :    usually is bit N-1
                   e.g. 1010 * 0101 + 11000011 + 00001000
                        acc    round
N = 4, thus, 4 bit operands, acc has 8 bits, and round is
added at bit 3 (i.e. N-1).
4.      negative result bit:
result[MSB]
```

-continued

```
result      :  X * Y + Accumulator + round
5.  (x is don't care)                              (proof 5)
    casex    ({sign_Product, sign_Acc, sign_Result,
rndprop})
                4'b0000: cout <= 0;
                4'b0001: cout <= 1;
                4'b001x: cout <= 0;
                4'b010x: cout <= 1;
                4'b0110: cout <= 0;
                4'b0111: cout <= 1;
                4'b100x: cout <= 1;
                4'b1010: cout <= 0;
                4'b1011: cout <= 1;
                4'b110x: cout <= 1;
                4'b111x: cout <= 1;
    endcase
sign_Product:    negative product bit from 1.
sign_Acc   :     negative accumulator bit from 2.
sign_Result:     negative result bit from 4.
Rndproop   :     round-bit propagate to MSB bit from 3.
Note:            There should be 2 carry bits (proof 5).
                 However, as implemented they are logically ORed
                 together, just to make it fit the traditional
                 circuit.
```

The following are 2 examples which illustrates 3 and 5. Finally, the proof for 1, 3, and 5 are provided. The area of this carry detection circuit, as in proof 5, is:

```
1    nr2          (2 p 2 n)
3    inv          (1 p 1 n)
1    ao21         (4 p 4 n)
1    oai2211      (5 p 5 n)
Total:    6 logic gates   14 p 14 n
nr2           : logical 2 input NOR gate,  i.e. ~ (J || K)
inv           : logical inverter           i.e. ~J
ao21          : logical 2 input AND-OR,    i.e. (J && K) ||
L
oai2211       : logical OR-AND-INV         i.e. ~ ((J || K) &&
(L || M))
```

The area of 1, 3, can be shared with different overflow, and zero detection circuit, which is usually in place with the carry out circuit.

EXAMPLES

Here is a brief examples of how 3, and 5 works. example for proof 3

The following are all binary numbers:
(0 is zero, 1 is one, X is don't care)

```
result without rounding       XXXXXXXXXXXXXXXX
plus rounding               + 0000000010000000
                            ------------------
result                        000000000XXXXXXX
``` bit k

One can deduce that the carryout from the leftmost bit is 1.

Explanation: if one adds 1 at bit k and gets 0 at the output, one knows that there is a carryout to the next bit (k+1) location. Again, if one adds that carry to bit k+1 and get a 0 at the output, one knows that there is a carryout to the next bit (k+2) location. Similar, one can continue on and on, thus deduct that there is a carryout from the leftmost bit.

Example for Proof 5

All numbers are 2's complement binary numbers
Suppose one adds two numbers and rounds.

```
          1111111111111111
      +   1111111111111111
      --------------------
      1   1111111111111110
                |
             carryout +     0000000010000000
      --------------------
     10     0000000001111110
            | |
          2 carryouts
```

Another example:

```
          0111111111111111
      +   1111111111111111
      --------------------
      1   0111111111111110
                |
             carryout +     0000000010000000
      --------------------
      1   1000000001111110
                |
             carryout
```

The circuit in previous work does not address the previous situations correctly.

Although the present invention has been described and illustrated in detail, it is clearly understood that the same is by way of illustration and example only and is not to be taken by way of limitation, the spirit and scope of the present invention being limited only by the terms of the appended claims and their equivalents.

APPENDIX A

| 1–8 sets of coefficients of PolyPhase1 (17 bits) | | | | |
|---|---|---|---|---|
| coeff. set#1 | | | | |
| h(1) = −1 | h(2) = 27 | h(3) = −67 | h(4) = 139 | h(5) = −252 |
| h(6) = 413 | h(7) = −627 | h(8) = 893 | h(9) = −1209 | h(10) = 1566 |
| h(11) = −1961 | h(12) = 2407 | h(13) = −2992 | h(14) = 4262 | h(15) = 65535 |
| h(16) = 100 | h(17) = −1039 | h(18) = 1230 | h(19) = −1196 | h(20) = 1058 |
| h(21) = −874 | h(22) = 678 | h(23) = −493 | h(24) = 333 | h(25) = −208 |

APPENDIX A-continued

1–8 sets of coefficients of PolyPhase1 (17 bits)

h(26) = 116  h(27) = −56  h(28) = 23
coeff. set#2

| | | | | |
|---|---|---|---|---|
| h(1) = 4 | h(2) = 15 | h(3) = −47 | h(4) = 109 | h(5) = −214 |
| h(6) = 374 | h(7) = −600 | h(8) = 905 | h(9) = −1296 | h(10) = 1790 |
| h(11) = −2420 | h(12) = 3280 | h(13) = −4705 | h(14) = 8606 | h(15) = 65535 |
| h(16) = −3834 | h(17) = 1038 | h(18) = −100 | h(19) = −296 | h(20) = 447 |
| h(21) = −466 | h(22) = 416 | h(23) = −332 | h(24) = 242 | h(25) = −160 |
| h(26) = 94 | h(27) = −48 | h(28) = 21 | | | coeff. set#3

| | | | | |
|---|---|---|---|---|
| h(1) = 4 | h(2) = 16 | h(3) = −51 | h(4) = 121 | h(5) = −242 |
| h(6) = 431 | h(7) = −707 | h(8) = 1088 | h(9) = −1598 | h(10) = 2271 |
| h(11) = −3178 | h(12) = 4502 | h(13) = −6866 | h(14) = 13956 | h(15) = 65535 |
| h(16) = −7117 | h(17) = 2771 | h(18) = −1182 | h(19) = 414 | h(20) = −22 |
| h(21) = −162 | h(22) = 255 | h(23) = −219 | h(24) = 179 | h(25) = −128 |
| h(26) = 80 | h(27) = −43 | h(28) = 20 | | | coeff. set#4

| | | | | |
|---|---|---|---|---|
| h(1) = 4 | h(2) = 16 | h(3) = −55 | h(4) = 133 | h(5) = −271 |
| h(6) = 490 | h(7) = −815 | h(8) = 1276 | h(9) = −1909 | h(10) = 2768 |
| h(11) = −3965 | h(12) = 5785 | h(13) = −9185 | h(14) = 20170 | h(15) = 65535 |
| h(16) = −10058 | h(17) = 4402 | h(18) = −2218 | h(19) = 1100 | h(20) = −478 |
| h(21) = 134 | h(22) = 39 | h(23) = −108 | h(24) = 117 | h(25) = −97 |
| h(26) = 67 | h(27) = −38 | h(28) = 20 | | | coeff. set#5

| | | | | |
|---|---|---|---|---|
| h(1) = 6 | h(2) = 14 | h(3) = −53 | h(4) = 134 | h(5) = −282 |
| h(6) = 523 | h(7) = −889 | h(8) = 1420 | h(9) = −2165 | h(10) = 3204 |
| h(11) = −4694 | h(12) = 7030 | h(13) = −11567 | h(14) = 27336 | h(15) = 65535 |
| h(16) = −12778 | h(17) = 6009 | h(18) = −3273 | h(19) = 1815 | h(20) = −962 |
| h(21) = 454 | h(22) = −165 | h(23) = 15 | h(24) = 48 | h(25) = −61 |
| h(26) = 51 | h(27) = −33 | h(28) = 19 | | | coeff. set#6

| | | | | |
|---|---|---|---|---|
| h(1) = 8 | h(2) = 9 | h(3) = −46 | h(4) = 127 | h(5) = −279 |
| h(6) = 535 | h(7) = −934 | h(8) = 1525 | h(9) = −2374 | h(10) = 3587 |
| h(11) = −5372 | h(12) = 8248 | h(13) = −14030 | h(14) = 35741 | h(15) = 65535 |
| h(16) = −15302 | h(17) = 7589 | h(18) = −4342 | h(19) = 2556 | h(20) = −1471 |
| h(21) = 796 | h(22) = −385 | h(23) = 150 | h(24) = −29 | h(25) = −21 |
| h(26) = 33 | h(27) = −26 | h(28) = 18 | | | coeff. set#7

| | | | | |
|---|---|---|---|---|
| h(1) = 11 | h(2) = 4 | h(3) = −37 | h(4) = 116 | h(5) = −270 |
| h(6) = 536 | h(7) = −963 | h(8) = 1610 | h(9) = −2561 | h(10) = 3948 |
| h(11) = −6033 | h(12) = 9478 | h(13) = −16632 | h(14) = 45840 | h(15) = 65535 |
| h(16) = −17631 | h(17) = 9120 | h(18) = −5402 | h(19) = 3301 | h(20) = −1990 |
| h(21) = 1148 | h(22) = −614 | h(23) = 291 | h(24) = −110 | h(25) = 21 |
| h(26) = 14 | h(27) = −19 | h(28) = 17 | | | coeff. set#8

| | | | | |
|---|---|---|---|---|
| h(1) = 14 | h(2) = −3 | h(3) = −25 | h(4) = 99 | h(5) = −252 |
| h(6) = 526 | h(7) = −976 | h(8) = 1675 | h(9) = −2723 | h(10) = 4283 |
| h(11) = −6676 | h(12) = 10721 | h(13) = −19390 | h(14) = 58232 | h(15) = 65535 |
| h(16) = −19790 | h(17) = 10603 | h(18) = −6452 | h(19) = 4050 | h(20) = −2517 |
| h(21) = 1507 | h(22) = −850 | h(23) = 437 | h(24) = −194 | h(25) = 64 |
| h(26) = −6 | h(27) = −12 | h(28) = 16 | | |

APPENDIX B

1–8 sets of coefficients of PolyPhase2 (17 bits)

coefficients set#1

| | | | | |
|---|---|---|---|---|
| h(1) = 7 | h(2) = −37 | h(3) = 73 | h(4) = −136 | h(5) = 221 |
| h(6) = −329 | h(7) = 453 | h(8) = −581 | h(9) = 694 | h(10) = −763 |
| h(11) = 741 | h(12) = −519 | h(13) = −377 | h(14) = 65535 | h(15) = 3463 |
| h(16) = −2306 | h(17) = 1798 | h(18) = −1431 | h(19) = 1119 | h(20) = −847 |
| h(21) = 613 | h(22) = −419 | h(23) = 268 | h(24) = −157 | h(25) = 81 |
| h(26) = −39 | h(27) = 7 | | | | coefficients set#2

| | | | | |
|---|---|---|---|---|
| h(1) = 7 | h(2) = −37 | h(3) = 74 | h(4) = −138 | h(5) = 226 |
| h(6) = −337 | h(7) = 467 | h(8) = −603 | h(9) = 728 | h(10) = −814 |

APPENDIX B-continued

1–8 sets of coefficients of PolyPhase2 (17 bits)

| | | | | |
|---|---|---|---|---|
| h(11) = 819 | h(12) = −644 | h(13) = −125 | h(14) = 65535 | h(15) = 3203 |
| h(16) = −2193 | h(17) = 1734 | h(18) = −1393 | h(19) = 1097 | h(20) = −834 |
| h(21) = 605 | h(22) = 416 | h(23) = 266 | h(24) = −157 | h(25) = 81 |
| h(26) = −39 | h(27) = 7 | | | | coefficients set#3

| | | | | |
|---|---|---|---|---|
| h(1) = 7 | h(2) = −38 | h(3) = 75 | h(4) = −141 | h(5) = 230 |
| h(6) = −346 | h(7) = 481 | h(8) = −625 | h(9) = 761 | h(10) = −865 |
| h(11) = 896 | h(12) = −769 | h(13) = 128 | h(14) = 65535 | h(15) = 2944 |
| h(16) = −2080 | h(17) = 1670 | h(18) = −1354 | h(19) = 1073 | h(20) = −820 |
| h(21) = 598 | h(22) = −412 | h(23) = 265 | h(24) = −156 | h(25) = 81 |
| h(26) = −39 | h(27) = 7 | | | | coefficients set#4

| | | | | |
|---|---|---|---|---|
| h(1) = 8 | h(2) = −38 | h(3) = 76 | h(4) = −143 | h(5) = 235 |
| h(6) = −354 | h(7) = 494 | h(8) = −647 | h(9) = 795 | h(10) = −915 |
| h(11) = 972 | h(12) = −894 | h(13) = 382 | h(14) = 65535 | h(15) = 2686 |
| h(16) = −1966 | h(17) = 1606 | h(18) = −1315 | h(19) = 1050 | h(20) = −866 |
| h(21) = 590 | h(22) = −408 | h(23) = 263 | h(24) = −156 | h(25) = 81 |
| h(26) = −39 | h(27) = 7 | | | | coefficients set#5

| | | | | |
|---|---|---|---|---|
| h(1) = 8 | h(2) = −38 | h(3) = 77 | h(4) = 145 | h(5) = 239 |
| h(6) = −362 | h(7) = 508 | h(8) = −668 | h(9) = 827 | h(10) = −965 |
| h(11) = 1048 | h(12) = −1018 | h(13) = 637 | h(14) = 65535 | h(15) = 2429 |
| h(16) = −1852 | h(17) = 1541 | h(18) = −1276 | h(19) = 1026 | h(20) = −792 |
| h(21) = 582 | h(22) = −404 | h(23) = 261 | h(24) = −155 | h(25) = 81 |
| h(26) = −39 | h(27) = 8 | | | | coefficients set#6

| | | | | |
|---|---|---|---|---|
| h(1) = 8 | h(2) = −39 | h(3) = 78 | h(4) = −147 | h(5) = 244 |
| h(6) = −369 | h(7) = 521 | h(8) = −689 | h(9) = 860 | h(10) = −1014 |
| h(11) = 1124 | h(12) = −1142 | h(13) = 894 | h(14) = 65535 | h(15) = 2174 |
| h(16) = −1738 | h(17) = 1476 | h(18) = −1236 | h(19) = 1001 | h(20) = −777 |
| h(21) = 574 | h(22) = −399 | h(23) = 259 | h(24) = −154 | h(25) = 81 |
| h(26) = −39 | h(27) = 8 | | | | coefficients set#7

| | | | | |
|---|---|---|---|---|
| h(1) = 8 | h(2) = −39 | h(3) = 79 | h(4) = −149 | h(5) = 248 |
| h(6) = −377 | h(7) = 533 | h(8) = −709 | h(9) = 891 | h(10) = −1062 |
| h(11) = 1198 | h(12) = −1265 | h(13) = 1151 | h(14) = 65535 | h(15) = 1919 |
| h(16) = −1622 | h(17) = 1410 | h(18) = −1195 | h(19) = 976 | h(20) = −762 |
| h(21) = 565 | h(22) = −395 | h(23) = 257 | h(24) = −153 | h(25) = 80 |
| h(26) = −39 | h(27) = 8 | | | | coefficients set#8

| | | | | |
|---|---|---|---|---|
| h(1) = 8 | h(2) = −39 | h(3) = 80 | h(4) = −151 | h(5) = 251 |
| h(6) = −384 | h(7) = 545 | h(8) = −728 | h(9) = 921 | h(10) = −1109 |
| h(11) = 1271 | h(12) = −1387 | h(13) = 1409 | h(14) = 65535 | h(15) = 1665 |
| h(16) = −1506 | h(17) = 1342 | h(18) = −1153 | h(19) = 950 | h(20) = −746 |
| h(21) = 556 | h(22) = −390 | h(23) = 254 | h(24) = −152 | h(25) = 80 |
| h(26) = −39 | h(27) = 8 | | | |

APPENDIX C

Half of the FIR filter coefficients of Sine #1 (not normalized)

| | | | | | | | | |
|---|---|---|---|---|---|---|---|---|
| $h_0 = 1$ | $h_1 = 5$ | $h_2 = 15$ | $h_3 = 35$ | $h_4 = 70$ | $h_5 = 126$ | $h_6 = 210$ | $h_7 = 330$ | $h_8 = 490$ |
| $h_9 = 690$ | $h_{10} = 926$ | $h_{11} = 1190$ | $h_{12} = 1470$ | $h_{13} = 1750$ | $h_{14} = 2010$ | $h_{15} = 2226$ | $h_{16} = 2380$ | $h_{17} = 2460$ |

APPENDIX D

N/2 coefficients of linear phase FIR1 (24 bits), N = 38

| | | | | |
|---|---|---|---|---|
| h(1) = −3363 | h(2) = −12069 | h(3) = −27056 | h(4) = −43884 | h(5) = −36017 |
| h(6) = 17858 | h(7) = 128486 | h(8) = 266726 | h(9) = 321261 | h(10) = 179350 |
| h(11) = −228950 | h(12) = −821735 | h(13) = −1280574 | h(14) = −1190828 | h(15) = −180214 |
| h(16) = 1820850 | h(17) = 4419986 | h(18) = 6887230 | h(19) = 8388607 | |

APPENDIX E

N/2 coefficients of linear phase FIR2 (24 taps), N = 126

| | | | | |
|---|---|---|---|---|
| h(1) = −71 | h(2) = −371 | h(3) = −870 | h(4) = −986 | h(5) = 34 |
| h(6) = 1786 | h(7) = 2291 | h(8) = 291 | h(9) = −2036 | h(10) = −943 |
| h(11) = 2985 | h(12) = 3784 | h(13) = −1458 | h(14) = −5808 | h(15) = −1007 |
| h(16) = 7756 | h(17) = 5935 | h(18) = −7135 | h(19) = −11691 | h(20) = 3531 |
| h(21) = 17500 | h(22) = 4388 | h(23) = −20661 | h(24) = −15960 | h(25) = 18930 |
| h(26) = 29808 | h(27) = −9795 | h(28) = 42573 | h(29) = −7745 | h(30) = 49994 |
| h(31) = 33021 | h(32) = −47092 | h(33) = −62651 | h(34) = 29702 | h(35) = 90744 |
| h(36) = 4436 | h(37) = −109189 | h(38) −54172 | h(39) = 109009 | h(40) = 114154 |
| h(41) = −81993 | h(42) = −174452 | h(43) = 22850 | h(44) = −221211 | h(45) = 68863 |
| h(46) = −238025 | h(47) = −187141 | h(48) = 208018 | h(49) = 318763 | h(50) = −116005 |
| h(51) = −443272 | h(52) = −49958 | h(53) = 533334 | h(54) = 298975 | h(55) = −553873 |
| h(56) = −642475 | h(57) = 454990 | h(58) = 1113788 | h(59) = −137179 | h(60) = −1854336 |
| h(61) = −766230 | h(62) = 3875315 | h(63) = 8388607 | | |

APPENDIX F

126 coefficients of minimal phase FIR2 filter (24 bits)

| | | | | |
|---|---|---|---|---|
| h(1) = 3706 | h(2) = 40279 | h(3) = 221174 | h(4) = 804845 | h(5) = 2146750 |
| h(6) = 4386648 | h(7) = 6953394 | h(8) = 8388607 | h(9) = 7090455 | h(10) = 2835288 |
| h(11) = −2253524 | h(12) = −4797671 | h(13) = −3039496 | h(14) = 1134795 | h(15) = 3610933 |
| h(16) = 2087476 | h(17) = −1456651 | h(18) = −2946553 | h(19) = −879504 | h(20) = 1992768 |
| h(21) = 2134637 | h(22) = −387002 | h(23) = −2162107 | h(24) = −976715 | h(25) = 1372312 |
| h(26) = 1679514 | h(27) = −297702 | h(28) = −1691061 | h(29) = −639397 | h(30) = 1204628 |
| h(31) = 1205395 | h(32) = −489236 | h(33) = −1344382 | h(34) = −210444 | h(35) = 1127050 |
| h(36) = 726304 | h(37) = −690038 | h(38) −980767 | h(39) = 183586 | h(40) = 976368 |
| h(41) = 266088 | h(42) = −771300 | h(43) = −576454 | h(44) = 452150 | h(45) = 714614 |
| h(46) = −107673 | h(47) = −690048 | h(48) = −188586 | h(49) = 543320 | h(50) = 390793 |
| h(51) = −328349 | h(52) = −480675 | h(53) = 101449 | h(54) = 467877 | h(55) = 94397 |
| h(56) = −376347 | h(57) = −228622 | h(58) = 243508 | h(59) = 294668 | h(60) = −99375 |
| h(61) = −292935 | h(62) = −22457 | h(63) = 246890 | h(64) = 113456 | h(65) = −167811 |
| h(66) = −157090 | h(67) = 86258 | h(68) = 164188 | h(69) = −15171 | h(70) = −145799 |
| h(71) = −41105 | h(72) = 106515 | h(73) = 72363 | h(74) = −61723 | h(75) = −80669 |
| h(76) = 22236 | h(77) = 72792 | h(78) = 6664 | h(79) = −56130 | h(80) = −23869 |
| h(81) = 36838 | h(82) = 30867 | h(83) = −19148 | h(84) = −30380 | h(85) = 5374 |
| h(86) = 25381 | h(87) = 3750 | h(88) = −18458 | h(89) = −8569 | h(90) = 11516 |
| h(91) = 10031 | h(92) = −5702 | h(93) = −9276 | h(94) = 1510 | h(95) = 7366 |
| h(96) = 1051 | h(97) = −5118 | h(98) = −2258 | h(99) = 3067 | h(100) = 2511 |
| h(101) = −1480 | h(102) = −2203 | h(103) = 423 | h(104) = 1657 | h(105) = 168 |
| h(106) = −1089 | h(107) = −411 | h(108) = 619 | h(109) = 440 | h(110) = −288 |
| h(111) = −359 | h(112) = 89 | h(113) = 429 | h(114) = 9 | h(115) = −148 |
| h(116) = −42 | h(117) = 76 | h(118) = 42 | h(119) = −31 | h(120) = −29 |
| h(121) = 10 | h(122) = 16 | h(123) = −1 | h(124) = −7 | h(125) = −1 |
| h(126) = 3 | | | | |

APPENDIX G

PROOFS

Here is the Proof for steps 1, 3 and 5.

Proof 1 negative product bit:
product of 2 numbers is negative iff
operand 1 is positive and operand 2 is negative or vice versa.
(Notice that if one number is zero, the result is zero, i.e. non-negative.)
Thus,
put in logic:
(op1[MSB] ^ op2[MSB]) && |op1 && |op2
The 1st term is true iff the sign bit of the 2 operands are different.
The 2nd term is true iff op1 is != 0.
The 3rd term is true iff op2 is != 0.
Therefore, for the whole expression to be true, op1 and op2 are both non-zero numbers of different polarity,
Or the product of op1 and op2 is negative.

-continued

APPENDIX G

Circuit:

| | | |
|---|---|---|
| 9 | nr31 | 6 transistors (3 p 3 n) |
| 2 | or31 | 8 transistors (4 p 4 n) |
| 2 | or41 | 10 transistors (5 p 5 n) |
| 2 | nd4 | 8 transistors (4 p 4 n) |
| 2 | nr8 | 22 transistors (11 p 11 n) |
| 1 | xnor2 | 10 transistors (5 p 5 n) |
| total: | | 160 transistors |
| | | (119 synopsys area) |

Proof 3

Let proposition P(i, const) means
For any binary number bnum and any integer const, add 1
to bnum[const] :
 if the sum[const] == sum[const+1] == sum[const+2]
 ==. . . == sum[const+i] == 0, then carryout form
 res[const+i] == 1
a. Examine P(0, const) :
  add 1 to bnum[const],
  (Proof by negation)
  assume carryout form sum[const+0] != 1

APPENDIX G -continued

```
    => carryout from sum[const+0] == 0 (binary number)
    => 1 && bnum[const]    == 0(carryout equation)
    => bnum[const]         == 0    (and property)
    => 1 ^ bnum[const]     == 1 (1 ^ 0 = 1)
    => sum[const]          == (1 ^ 0 = sum)
Thus,
For any binary number bnum and any integer const,
add 1 to bnum[const]:
if sum[const] != 1, then carryout from sum[const] == 1;
Or,
For any binary number bnum and any integer const,
add 1 to bnum[const]:
if sum [const] == 0, then carryout from sum[const] == 1.
  b.  Assuming P(n,const) is true for all integer n < any
      integer k
  c.  Examine P(k+1, const) :
      add 1 to bnum[const],
1 assume sum[const] == sum[const+1] == ... ==
sum[const+k+1]= 0
2 => cout from sum[const], sum[const], ...
sum[const+k] == 1
(By P(0, const), P(1, const), ... P(k, const))
3 => cout from sum[const+k] == cin to sum[const+k+1]
== 1 (add)
4 => cin to sum[const+k+1] ^ bnum[const+k+1] == 0   (1)
5 => 1 ^ bnum[const+k+1] == 0              (3)
6 => bnum [const+k+1] == 1                 (xor)
7 => 1 && bnum [const+k+1] == 1            (and)
8 => cout [const+k+1] == 1
Thus,
For any binary number bnum and any integer const,
add 1 to bnum [const]:
if sum [const] == sum [const+1] == ... ==
sum [const+k+1] == 0,
then, cout from sum [const+k+1] == 1.
From a., b., c. and principles of mathematical induction,
For any binary number bnum and any integer const,
add 1 to bnum [const]:
if sum [const] == sum [const+1] == ... == sum
[const+n] == 0,
then, cout from sum [const+n] == 1. (for all
integer n >= 0)
Proof (5) of carry logic:

Case without rounding:
For case without rounding, the carryout bit from MSB is
easy to determined.
(Sign_Product && Sign_Acc) || ( Cin && (Sign_Product ||
Sign_Acc))
However, we do not have Cin to MSB. Thus we have to find
Cin to MSB from the Sign_Res.
Sign_Res = Sign_Product ^ Sign_Acc ^ Cin
-> Cin = Sign_Product ^ Sign_Acc ^ Sign_Res
Put back to previous equation:
casex ({sign_Product, sign_Acc, sign_Result})
    3'b000: cout <= 0;
    3'b001: cout <= 0;
    3'b010: cout <= 1;
    3'b011: cout <= 0;
    3'b100: cout <= 1;
    3'b101: cout <= 0;
    3'b110: cout <= 1;
    3'b111: cout <= 1;
Case with rounding:
For case with rounding, the carryout bit from MSB is
determined this way.
Co0 = SUM2 (sign_Prod, Sign_Acc, Cin, Rnd_prop) ||
SUM3 (sign_Prod, Sign_Acc, Cin, Rnd_prop)
(proof 3)
Co1 = SUM4 (sign_Prod, Sign_Acc, Cin, Rnd_prop)
Where Cin is the carry in to MSB without rounding.
As before, Cin can be determined from the Result.
Sign_res = sign_Prod ^ sign_Acc ^ Cin ^ Rnd_prop
-> Cin = sign_Prod ^ sign_Acc ^ sign_Res ^ Rnd_prop
Thus,
casex ({sign_Prod, sign_Acc, sign_Res, rnd_prop})
    4'b0000: Co0 <= 0;
```

APPENDIX G -continued

```
    4'b0001: Co0 <= 1;
    4'b0010: Co0 <= 0;
    4'b0011: Co0 <= 0;
    4'b0100: Co0 <= 1;
    4'b0101: Co0 <= 1;
    4'b0110: Co0 <= 0;
    4'b0111: Co0 <= 1;
    4'b1000: Co0 <= 1;
    4'b1001: Co0 <= 1;
    4'b1010: Co0 <= 0;
    4'b1011: Co0 <= 1;
    4'b1100: Co0 <= 1;
    4'b1101: Co0 <= 0;
    4'b1110: Co0 <= 1;
    4'b1111: Co0 <= 1;
    casex ({sign_Prod, sign_Acc, sign_Res, rnd_prop})
        4'b1101: Co1 <= 1;
        default: Co1 <= 0;
Traditionally, there is one carry bit, thus, I logical OR
the previous Co0 and Co1 together, which becomes:
casex ({sign_Product, sign_Acc, sign_Result, rndprop})
    4'b0000: cout <= 0;
    4'b0001: cout <= 1;
    4'b001x: cout <= 0;
    4'b010x: cout <= 1;
    4'b0110: cout <= 0;
    4'b0111: cout <= 1;
    4'b110x: cout <= 1;
    4'b1010: cout <= 0;
    4'b1011: cout <= 1;
    4'b110x: cout <= 1;
    4'b1111: cout <= 1;
endcase
Synopsys Area: 24
1     nr2 (2 p 2 n)
3     inv (1 p 1 n)
1     ao21 (4 p 4 n)
1     oai2211 (5 p 5 n)
Total: 6 logic gates 14 p 14 n
```

What is claimed is:

1. A sinc filter comprising:

a register to store digital data and to partition the digital data into at least two symmetrical multibit words and at least two partial words at the extreme ends of said register, wherein the two partial words are to be combined into a single word for processing;

a memory coupled to the register to store output values, the output values are partial sums of at least two product terms wherein each product term is a product of one of a plurality of numeric values of a symmetrical multibit word and a respective one of a plurality of filter coefficients, and a given partial sum is constructed from less than all products terms;

a look-up logical circuit coupled to the memory wherein the output values corresponding to a first word of the at least two symmetrical multibit words are looked up in the memory according to a first memory address formed by the numeric values of the first word, and the output values corresponding to a second word of the at least two symmetrical multibit words are looked up according to a second memory address formed by reversing the bit-order of the numeric values of the second word and referencing the output values corresponding to the reversed bit-order numeric values; and a summing circuit to sum the output values from the look-up logical circuit to provide a filter output.

2. The sinc filter of claim 1, wherein said look-up logical circuit uses a same set of numeric values for either side of a dividing line of said register.

3. The sinc filter of claim 1, wherein said memory to include one or more look up tables.

4. The sinc filter of claim 3 wherein said one or more look up tables are implemented using read only memory.

5. The sinc filter of claim 3 wherein said one or more look up tables are implemented using logic.

6. A sinc filter comprising:
a register to store a 1-bit wide digital data and to partition contents of the 1-bit wide digital data into at least two symmetrical multibit words and at least two partial words at the extreme ends of the said register, wherein the two partial words are to be combined into a single word for processing;
a memory coupled to the register wherein the memory to store output values for only one of the at least two symmetrical multibit words and wherein the output values are partial sums of at least two product terms wherein each product term is a product of one of a plurality of numeric values for the one symmetrical multibit word and a respective one of a plurality of filter coefficients, and a given partial sum is constructed from less than all products terms;
a look-up logical circuit coupled to the memory wherein the output values are looked up according to the numeric values and the output values for a corresponding symmetrical other of the at least two symmetrical multibit words are looked up by reversing bit-order of the numerical values and referencing the output values corresponding to the reversed bit-order numeric values; and
a summing circuit for summing the output values from the look-up logical circuit to provide a filter output.

7. A method comprising:
partitioning digital data stored in a register into at least two symmetrical multibit words and at least two partial words at the extreme ends of said register, wherein the two partial words are to be combined into a single word for processing;
storing in a memory output values, the output values are partial sums of at least two product terms wherein each product term is a product of one of a plurality of numeric values of a symmetrical multibit word and a respective one of a plurality of filter coefficients, and a given partial sum is constructed from less than all products terms;
looking up, by a look-up logical circuit, the output values corresponding to a first word of the at least two symmetrical multibit words in the memory according to a first memory address formed by the numeric values of the first word, and looking up the output values corresponding to a second word of the at least two symmetrical multibit words according to a second memory address formed by reversing the bit-order of the numeric values of the second word and referencing the output values corresponding to the reversed bit-order numeric values; and
summing the output values from the look-up logical circuit to provide a filter output.

8. The method of claim 7 wherein the looking up includes using, by the look-up logical circuit, a same set of numeric values for either side of a dividing line of said register.

9. The method of claim 7 wherein said memory to include one or more look up tables.

10. A method comprising:
partitioning data stored in a register into a plurality of symmetrical multibit words and at least two partial words at the extreme ends of said register, wherein the two partial words are to be combined into a single word for processing;
storing in a memory output values, the output values are partial sums of at least two product terms wherein each product term is a product of one of a plurality of numeric values of a symmetrical multibit word and a respective one of a plurality of filter coefficients, and a given partial sum is constructed from less than all product terms; and
referencing the output values corresponding to a first word of the plurality of symmetrical multibit words in the memory according to a first memory address formed by the numeric values of the first word, and referencing the output values corresponding to a second word of the plurality of symmetrical multibit words according to a second memory address formed by reversing the bit order of the numeric values of the second word and referencing the output values corresponding to the reversed bit-order numeric values.

11. A method comprising:
partitioning 1 bit wide data into an ordered plurality of symmetrical multibit words and a first and second partial word at each end of the ordered plurality;
combining the first and second partial words into a combined full word;
using the combined full word to look up a first interim result from a look up table having partial sums of at least two product terms wherein each product term is a product of one of a plurality of numeric values for only one symmetrical set of symmetrical multibit words and a respective one of a plurality of filter coefficients, and a given partial sum is constructed from less than all product terms, and further wherein the first interim result is selected based on numeric values in the combined full word;
using at least first and second multibit words to look up second and third interim results, respectively;
reversing bit order of the at least first and second multibit words to form first and second reversed bit-order words, respectively and using the first and second reversed bit-order words to look up fourth and fifth interim results; and
combining all interim results to provide a filter output.

12. A sinc filter comprising:
a register to store data and to partition said data into N multibit words and at least two partial words at the extreme ends of said register, where N is an integer and N≧4 said N multibit words include N/2 sets of symmetrical multibit words, wherein the two partial words are to be combined into a single word for processing;
a memory coupled to the register including a lookup table of size $2^{L/N}$, where L is a length of said filter, to reduce memory requirements of said filter, said lookup table to store output values, the output values are partial sums of at least two product terms wherein each product term is a product of one of a plurality of numeric values of a symmetrical multibit word and a respective one of a plurality of filter coefficients, and a given partial sum is constructed from less than all product terms;
a look-up logical circuit coupled to the memory wherein the output values corresponding to a first word of a set of symmetrical multibit words are looked up in the lookup table according to a first memory address formed by the numeric values of the first word, and the output values corresponding to a second word of the set of symmetrical multibit words are looked up according to a second memory address formed by reversing the bit order of the numeric values of the second word and referencing the output values corresponding to the reversed bit-order numeric values; and a summing circuit to sum the output values from the look-up logical circuit to provide a filter output.

13. An integrated circuit, comprising a sinc filter to partition digital data stored in a register into at least two symmetrical multibit words and at least two partial words at the extreme ends of said register, to combine the two partial words into a single word for processing, to store in a memory output values wherein the output values are partial sums of at least two product terms wherein each product term is a product of one of a plurality of numeric values of a symmetrical multibit word and a respective one of a plurality of filter coefficients, and a given partial sum is constructed from less than all product terms, to look up the output values corresponding to a first word of the at least two symmetrical multibit words in the memory according to a first memory address formed by the numeric values of the first word, and to look up the output values corresponding to a second word of the at least two symmetrical multibit words by reversing the bit order of the numeric values of the second word and referencing the output values corresponding to the reversed bit-order numeric values, to sum the output values to provide a filter output.

14. A computer product, comprising:

a memory medium; and a set of instructions, stored on said medium, said instructions to cause the partitioning of data stored in a register into at least two symmetrical multibit words and at least two partial words at the extreme ends of said register, wherein the two partial words are to be combined into a single word for processing; storing in a memory output values wherein the output values are partial sums of at least two product terms wherein each product term is a product of one of a plurality of numeric values of a symmetrical multibit word and a respective one of a plurality of filter coefficients, and a given partial sum is constructed from less than all product terms; and looking up the output values corresponding to a first word of the at least two symmetrical multibit words in the memory according to a first memory address formed by the numeric values of the first word, and looking up the output values corresponding to a second word of the at least two symmetrical multibit words according to a second memory address formed by reversing the bit order of the numeric values of the second word and referencing the output values corresponding to the reversed bit-order numeric values.

* * * * *